US008017507B2

(12) United States Patent
Okumura

(10) Patent No.: US 8,017,507 B2
(45) Date of Patent: Sep. 13, 2011

(54) METHOD OF MANUFACTURING A POLYCRYSTALLINE SEMICONDUCTOR THIN FILM

(75) Inventor: Hiroshi Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/775,996

(22) Filed: May 7, 2010

(65) Prior Publication Data

US 2010/0221899 A1 Sep. 2, 2010

Related U.S. Application Data

(62) Division of application No. 10/558,073, filed as application No. PCT/JP2004/003385 on Mar. 15, 2004, now Pat. No. 7,745,822.

(30) Foreign Application Priority Data

Jun. 27, 2003 (JP) ................................. 2003-184595

(51) Int. Cl.
*H01L 21/20* (2006.01)
*H01L 21/36* (2006.01)

(52) U.S. Cl. ................................. 438/487; 257/E21.133

(58) Field of Classification Search ........... 257/E21.133, 257/75; 438/487
See application file for complete search history.

(56) References Cited

U.S. PATENT DOCUMENTS

| 5,583,369 | A | 12/1996 | Yamazaki et al. |
| 5,648,276 | A | 7/1997 | Hara et al. |
| 5,851,862 | A | 12/1998 | Ohtani et al. |
| 5,946,561 | A | 8/1999 | Yamazaki et al. |
| 6,133,583 | A | 10/2000 | Ohtani et al. |
| 6,326,286 | B1 | 12/2001 | Park et al. |
| 6,432,758 | B1 | 8/2002 | Cheng et al. |
| 6,501,095 | B2 | 12/2002 | Yamaguchi et al. |
| 6,548,842 | B1 | 4/2003 | Bulucea et al. |
| 7,262,431 | B2 | 8/2007 | Hara et al. |
| 2007/0228374 | A1 | 10/2007 | Hayakawa |

FOREIGN PATENT DOCUMENTS

| DE | 198 20 441 | 11/1998 |
| FR | 2 766 613 | 4/1998 |
| GB | 2 325 342 | 11/1998 |
| JP | 02-283073 | 11/1990 |
| JP | 04-286335 | 10/1992 |
| JP | 06-089905 | 3/1994 |
| JP | 06-252398 | 9/1994 |
| JP | 07-249779 | 9/1995 |
| JP | 08-071780 | 3/1996 |

(Continued)

OTHER PUBLICATIONS

James S. Im et al. "Crystalline Si Films for Integrated Active-Matrix Liquid-Crystal Displays", Mar. 1996, p. 39-48.

(Continued)

*Primary Examiner* — William D Coleman
(74) *Attorney, Agent, or Firm* — Young & Thompson

(57) ABSTRACT

A TFT and the like capable of realizing performances such as a low threshold voltage value, high carrier mobility and a low leak current easily. A TFT consists of a polycrystalline Si film having a small heat capacity part and a large heat capacity part, and the small heat capacity part is used at least as a channel part. The polycrystalline Si film is formed of a crystal grain film through laser annealing of an energy density with which the small heat capacity part melts completely but the large heat capacity part does not melt completely. Since the channel part is formed of large crystal grains grown from the boundaries between the small heat capacity part and the large heat capacity parts, it is possible to realize performances such as a low threshold voltage value, high carrier mobility and a low leak current by using a typical laser annealing device.

3 Claims, 18 Drawing Sheets

FOREIGN PATENT DOCUMENTS

| | | |
|---|---|---|
| JP | 10-321870 | 12/1998 |
| JP | 11-219905 | 8/1999 |
| JP | 2002-261015 | 9/2002 |
| JP | 2002-299632 | 10/2002 |
| JP | 2003-031496 | 1/2003 |
| JP | 2003-115497 | 4/2003 |
| JP | 2003-332346 | 11/2003 |

OTHER PUBLICATIONS

J. Yanase et al. "P-54: High Mobility Nucleation Controlled Poly-Si TFTs by Using Conventional ELA Equipment", Sep. 16-18, 2003, p. 333-336.

J. Yanase et al. "TFT Characteristics of Nucleation Controlled poly-Si Thin Film by Using Conventional ELA Equiptment", Dec. 3-5, 2003, p. 315-318.

FIG. 1
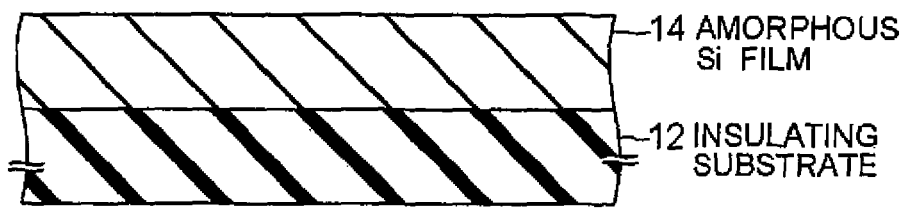
[2]
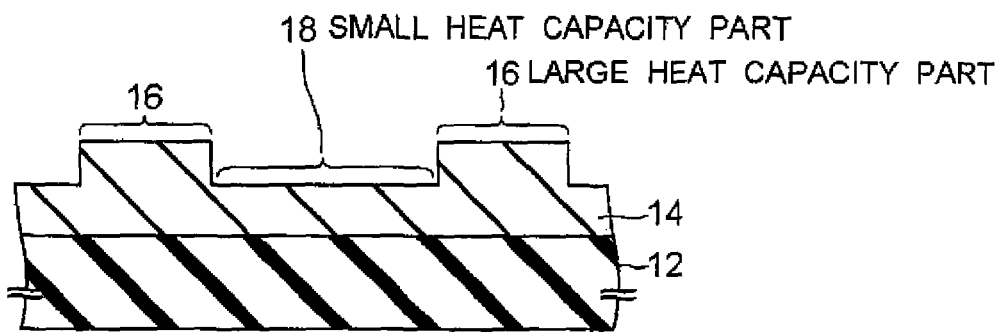
[3]
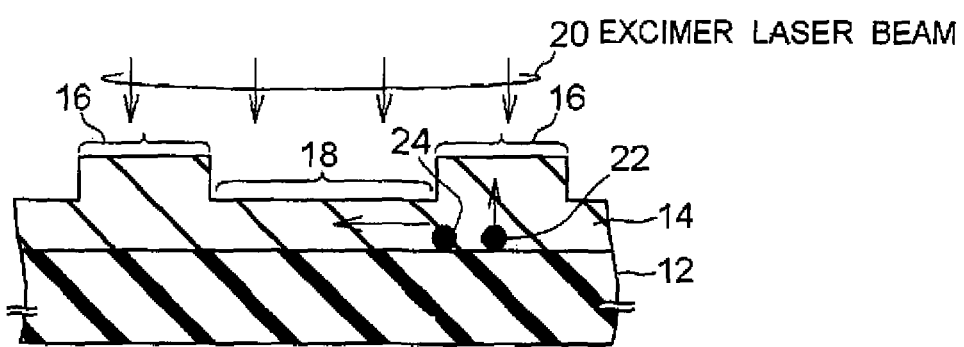
[4]
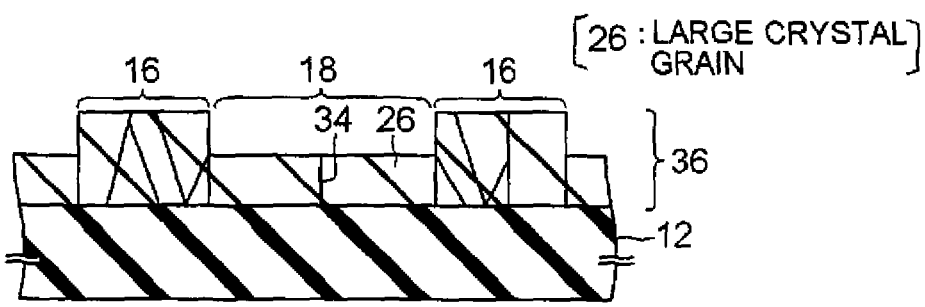

FIG. 2
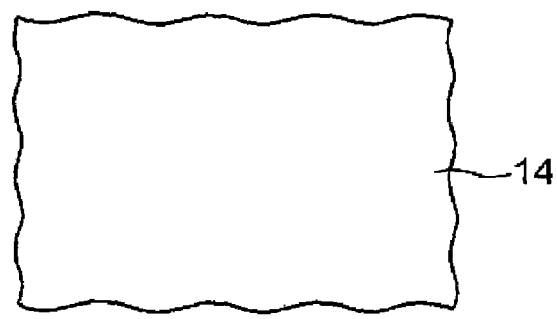
[2]
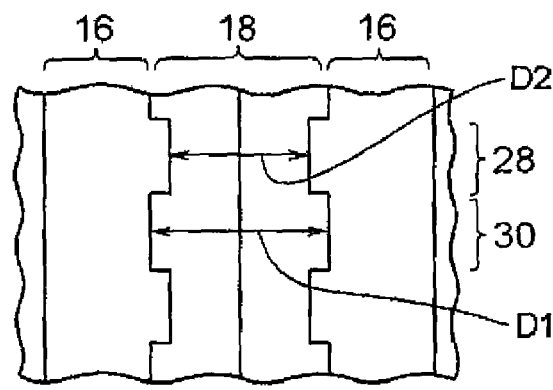
[3]
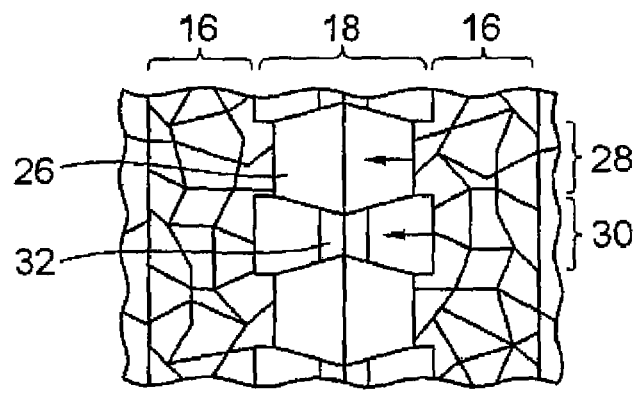
[4]
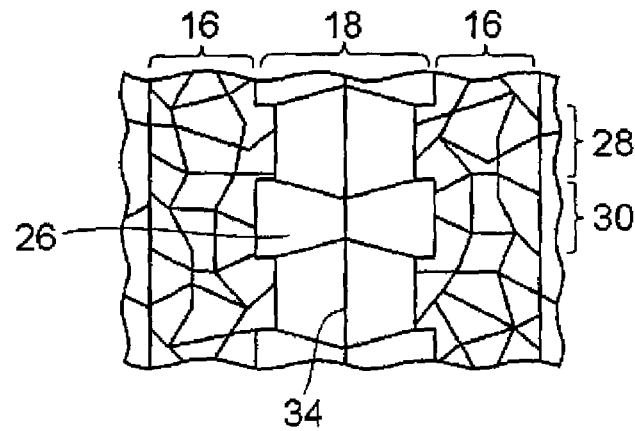

FIG. 4
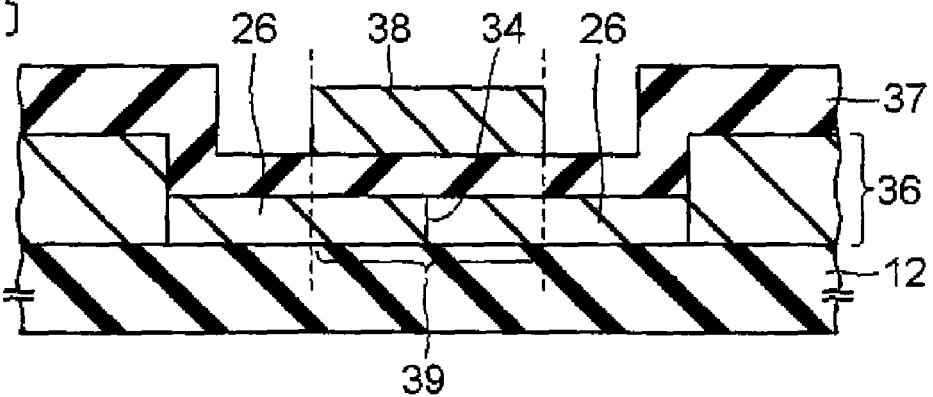
[1]
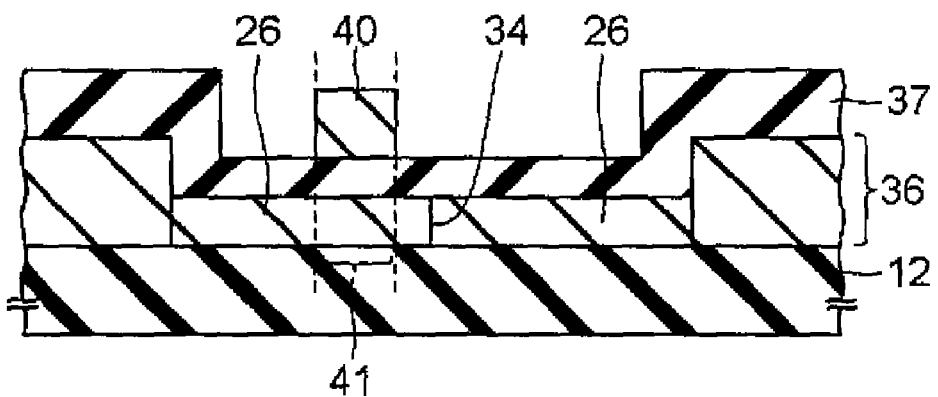
[2]
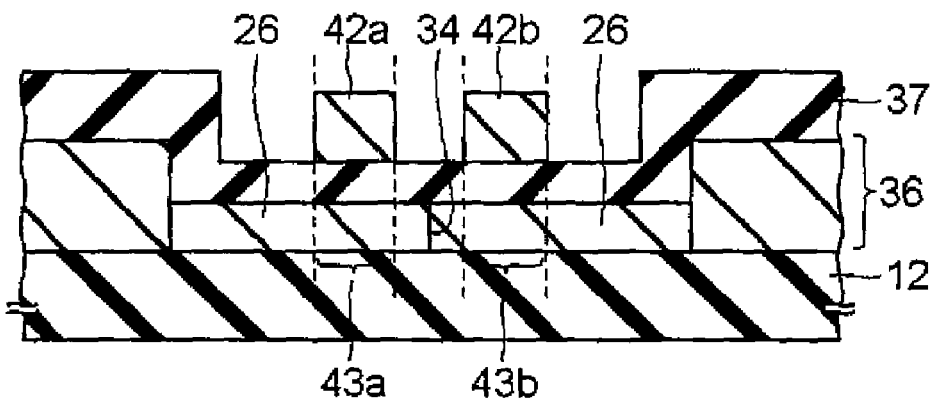
[3]

FIG. 5
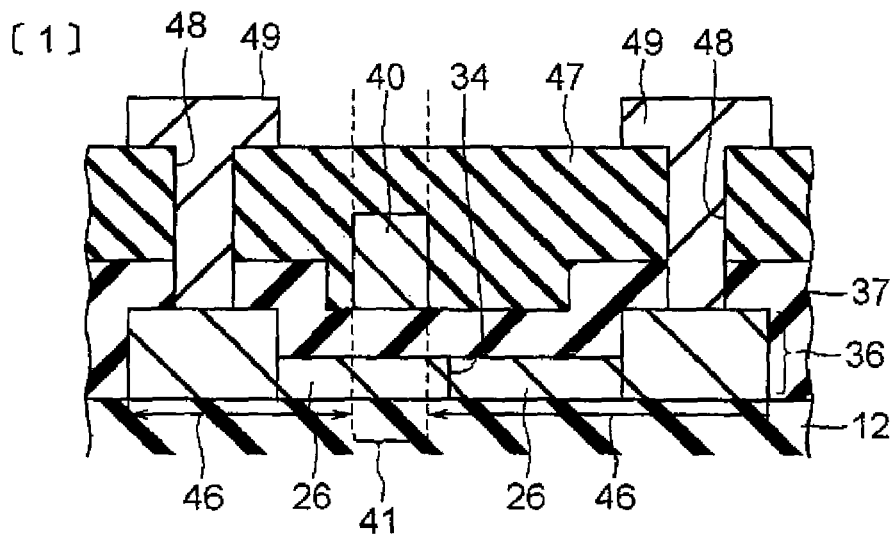
[2]
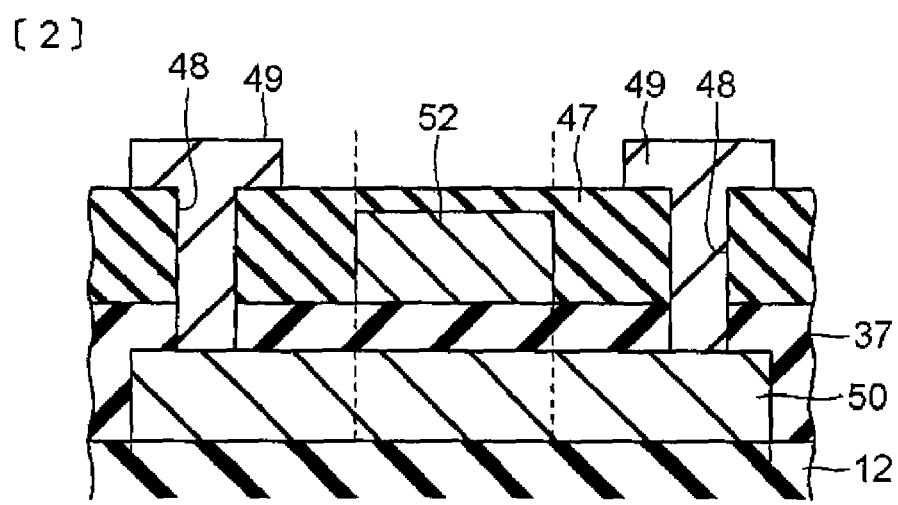
[3]
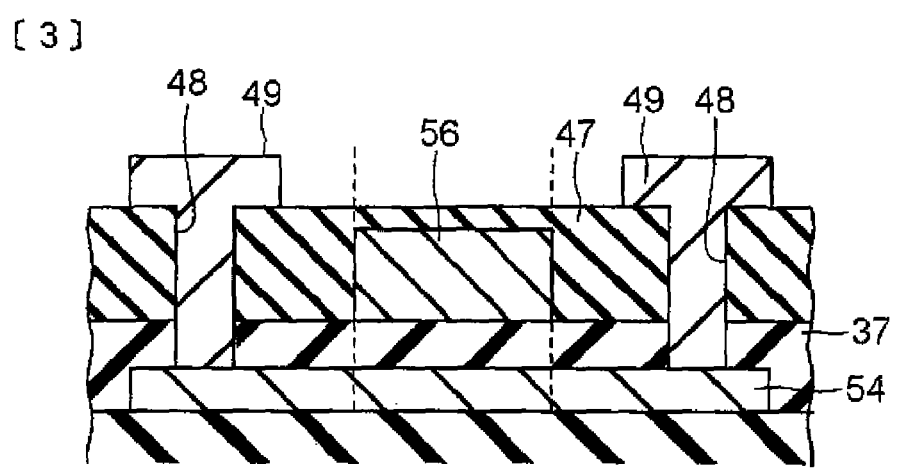

FIG. 6
[2]
[3]
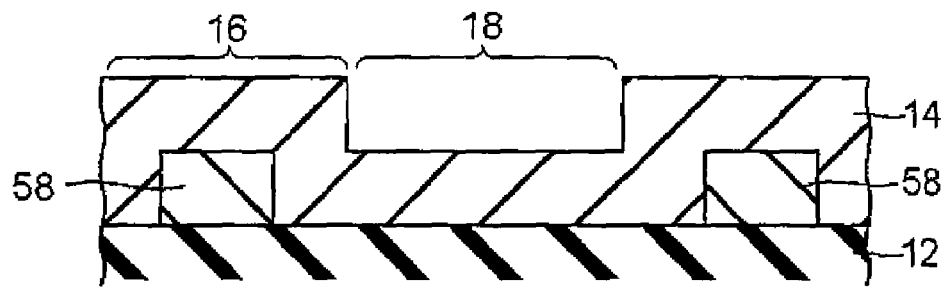
[4]
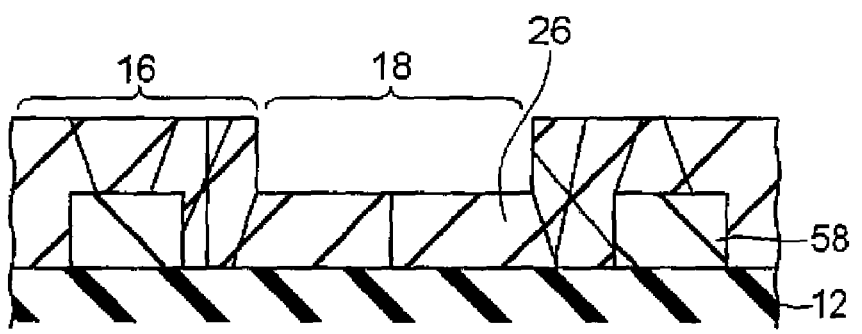

FIG. 7
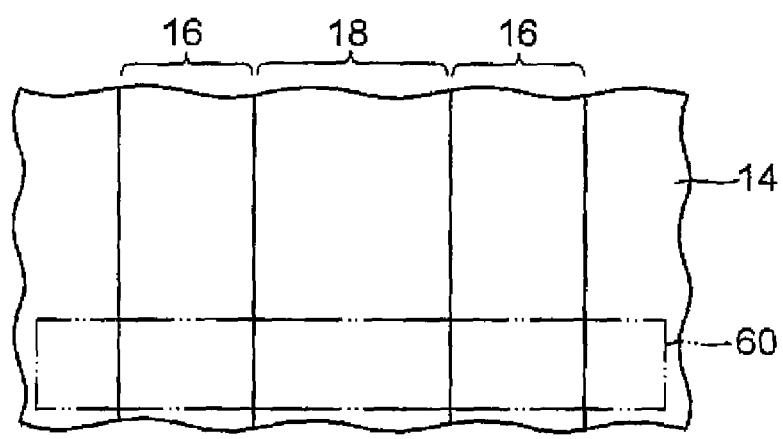
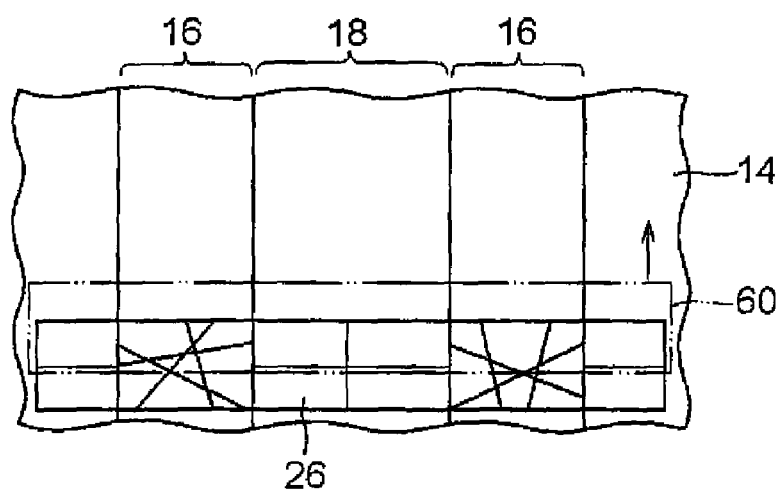
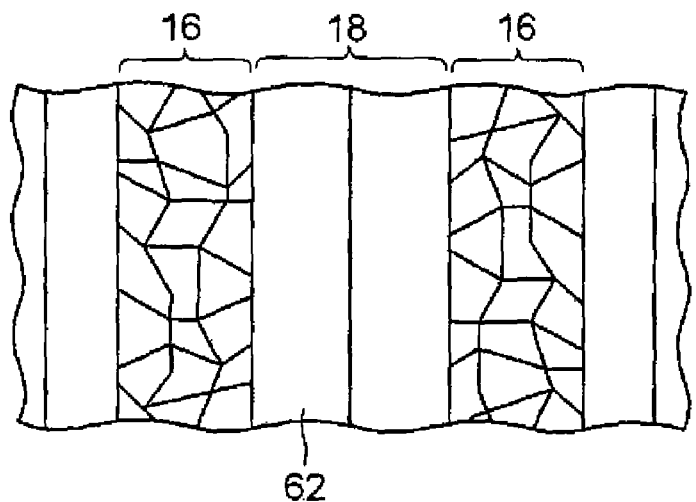

FIG. 8
[2]
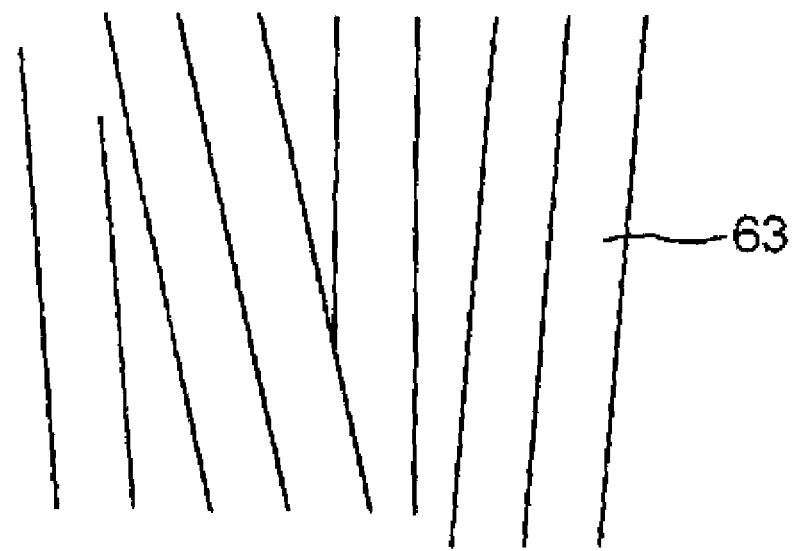

FIG. 9
[ 1 ]
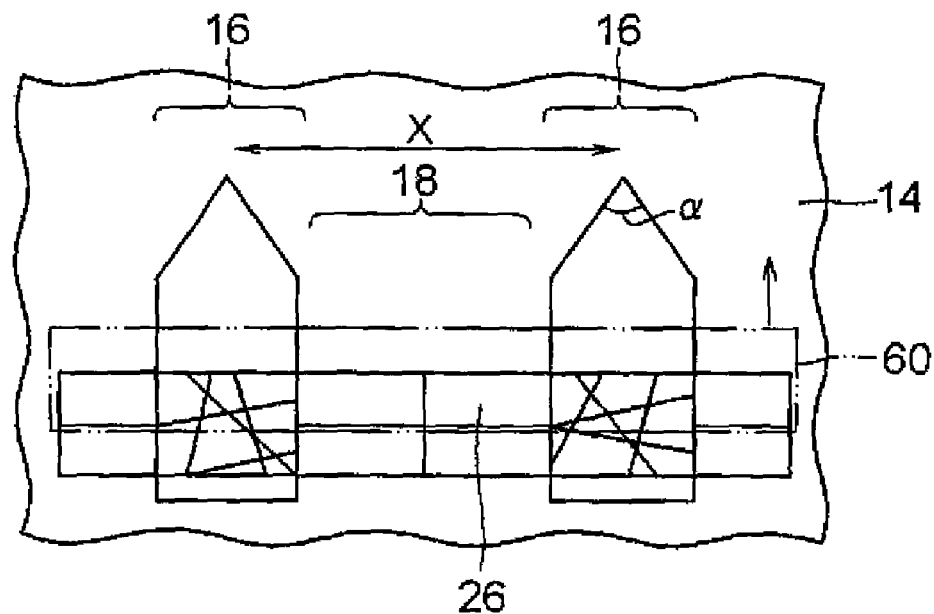
[ 2 ]
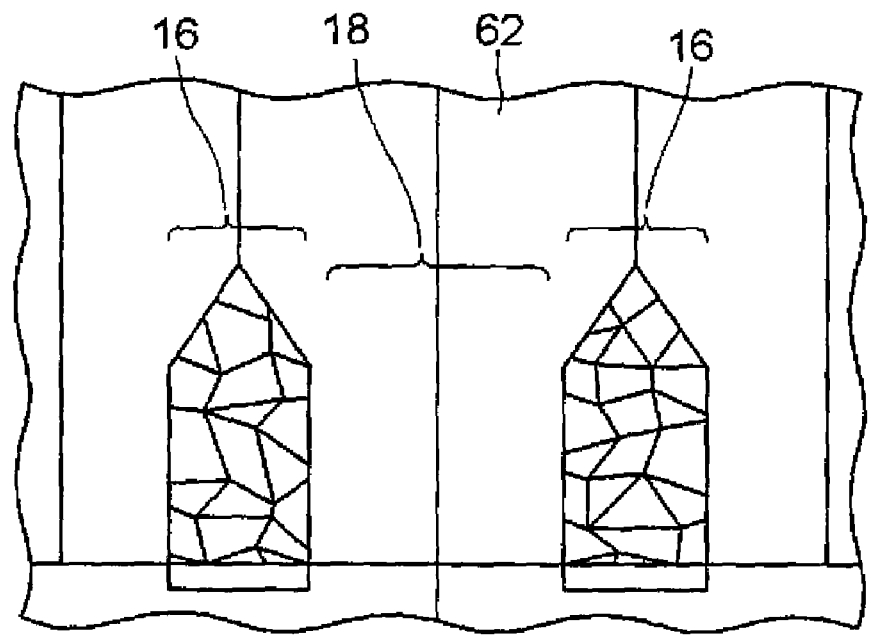

FIG. 11
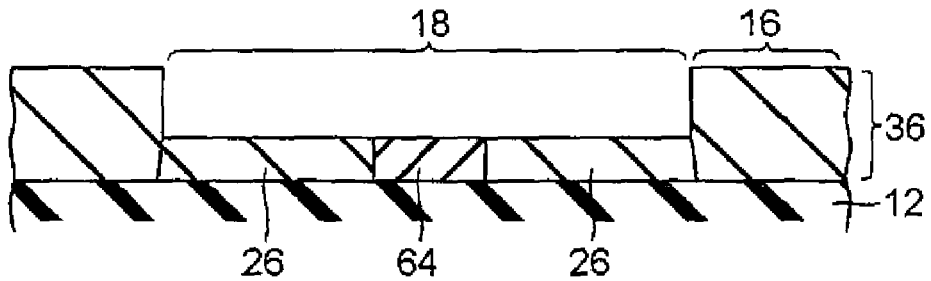
[2]
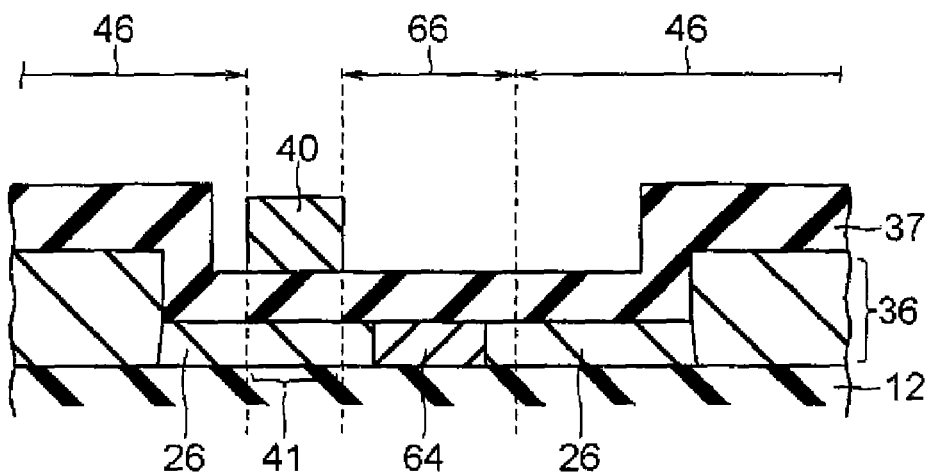
[3]
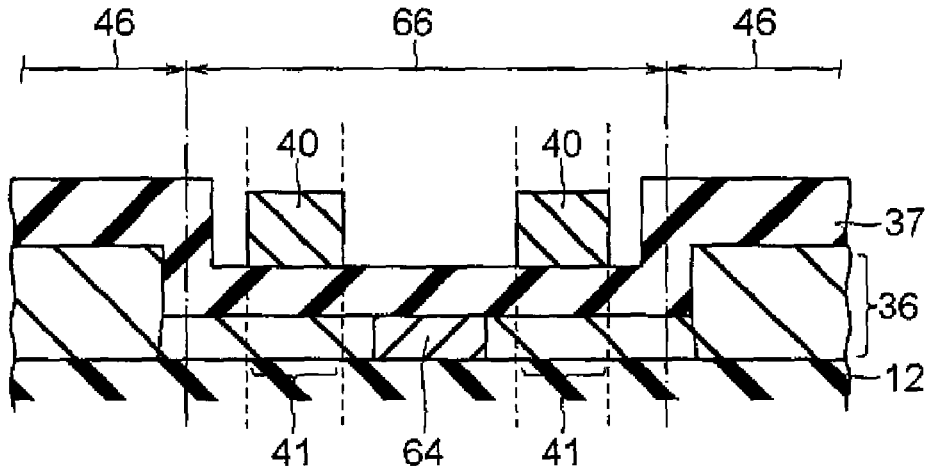

FIG. 13
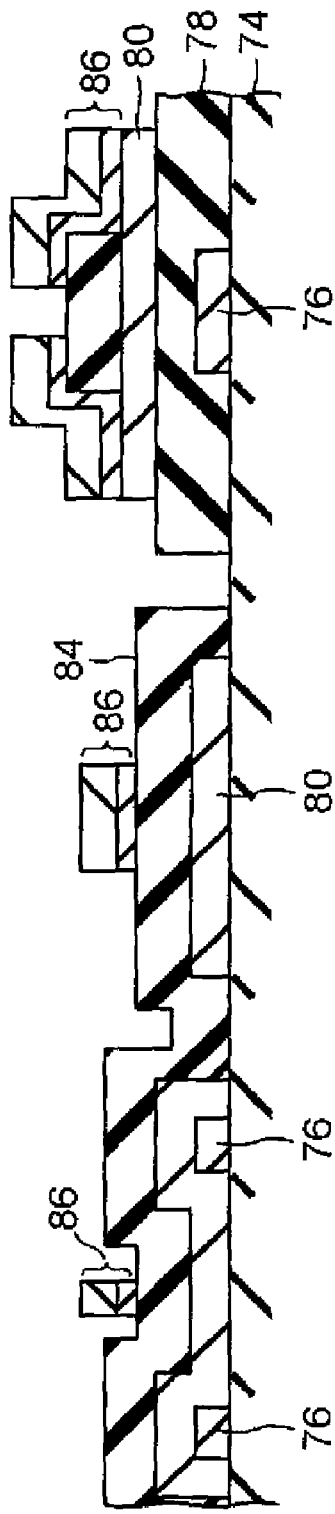
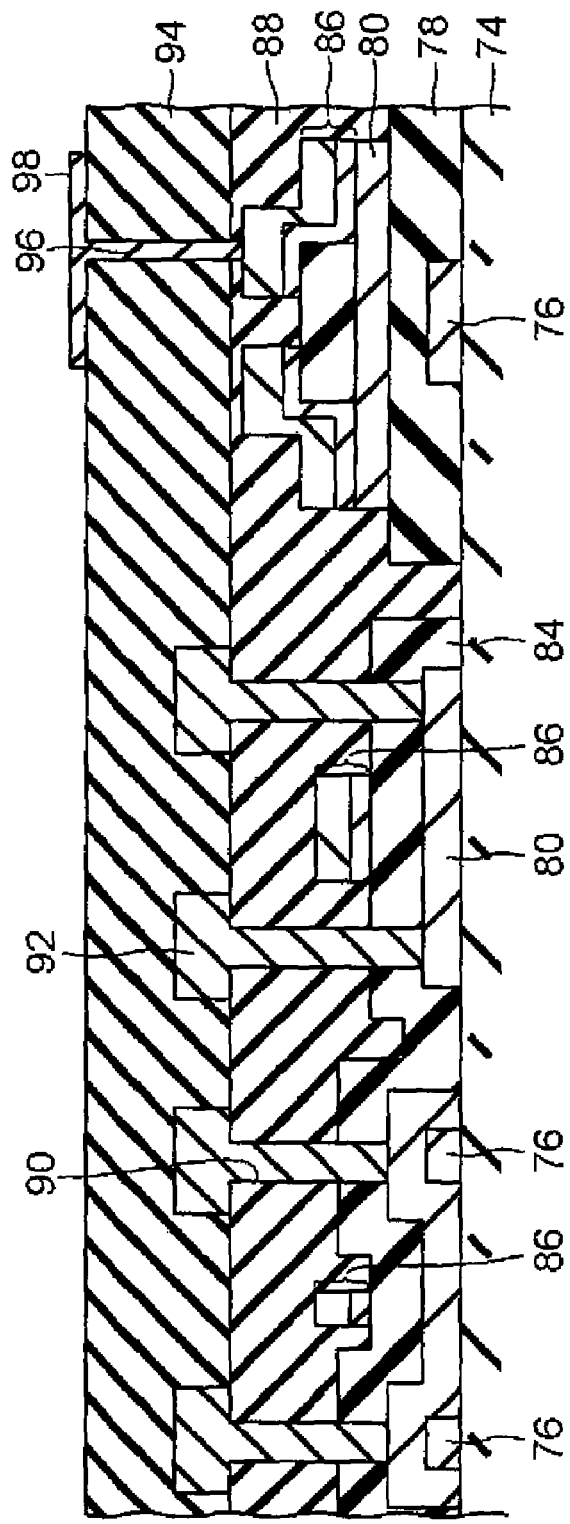

FIG. 14
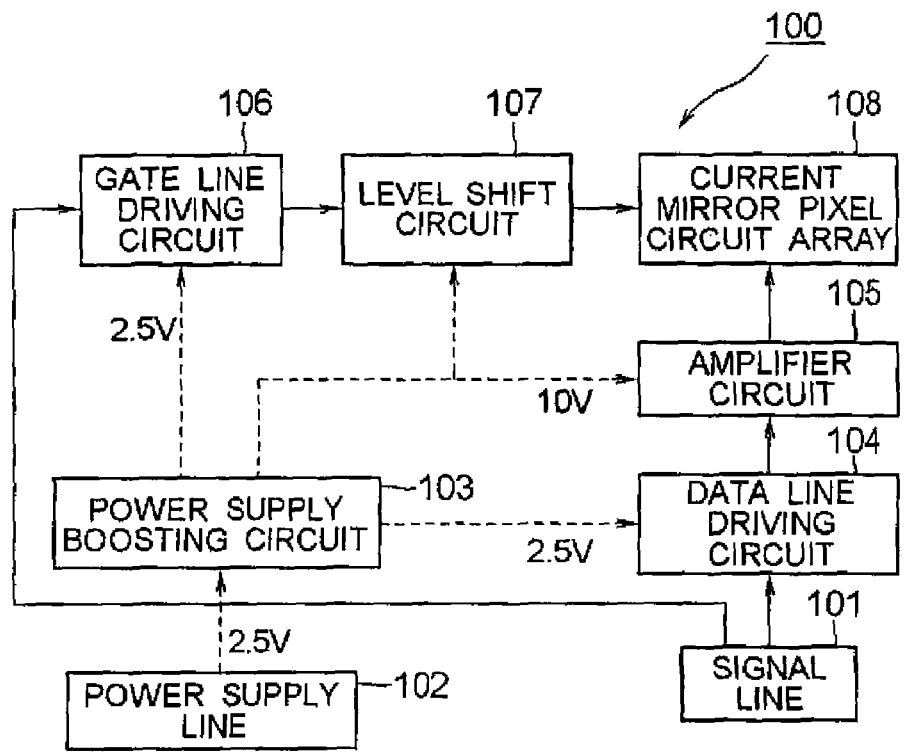
[2]
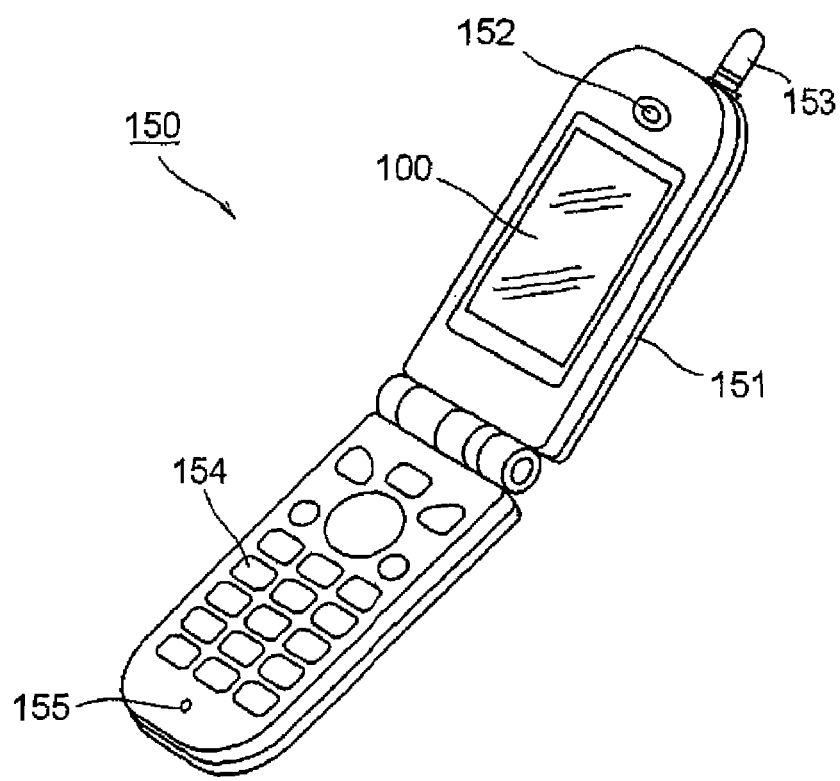

FIG. 15
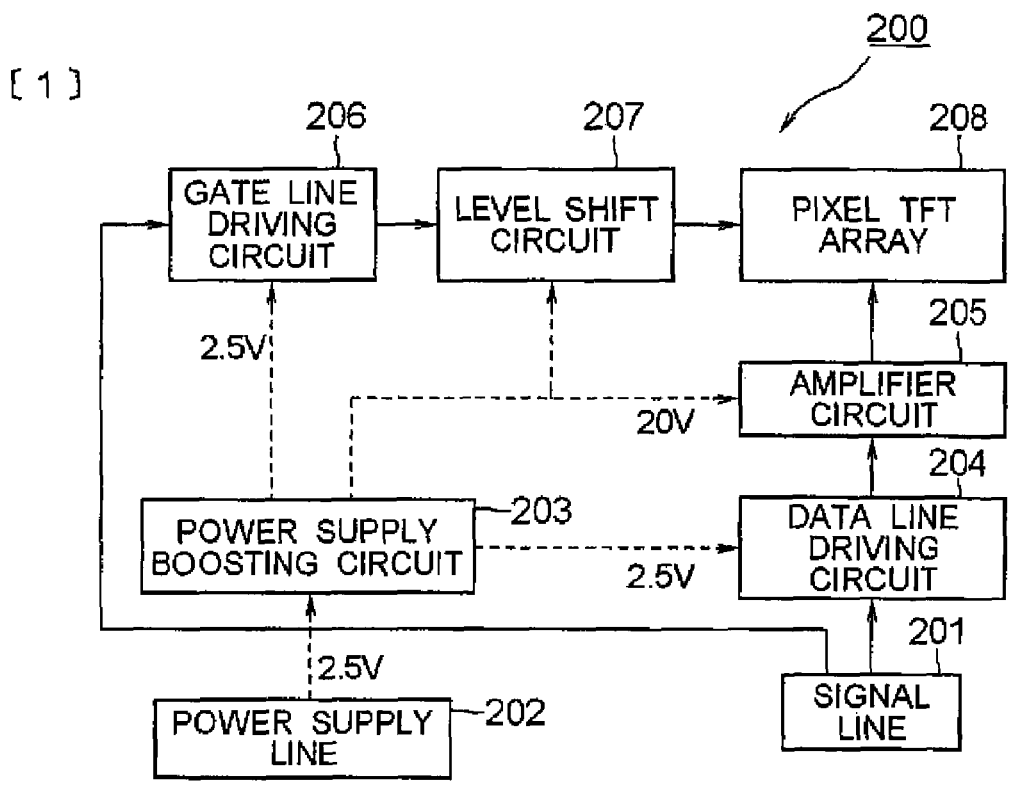
[2]
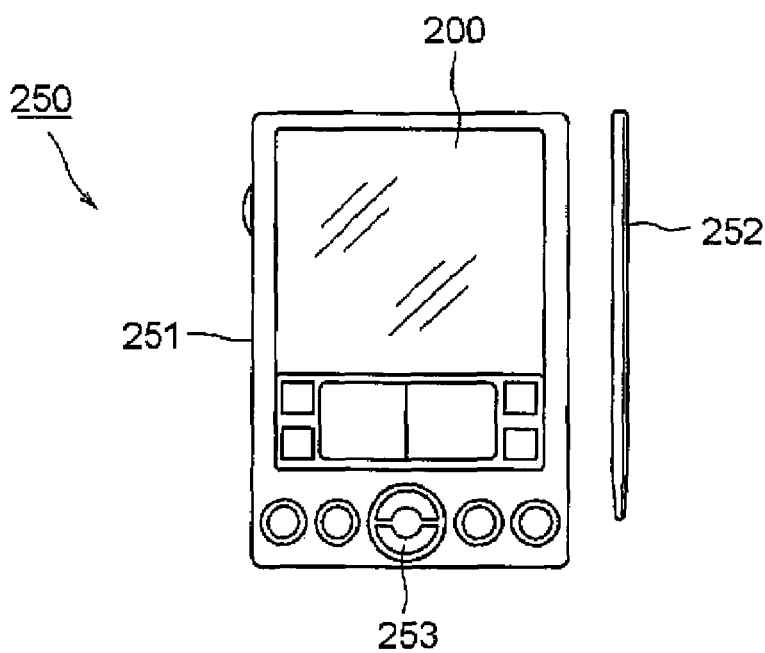

FIG. 16
[ 1 ]
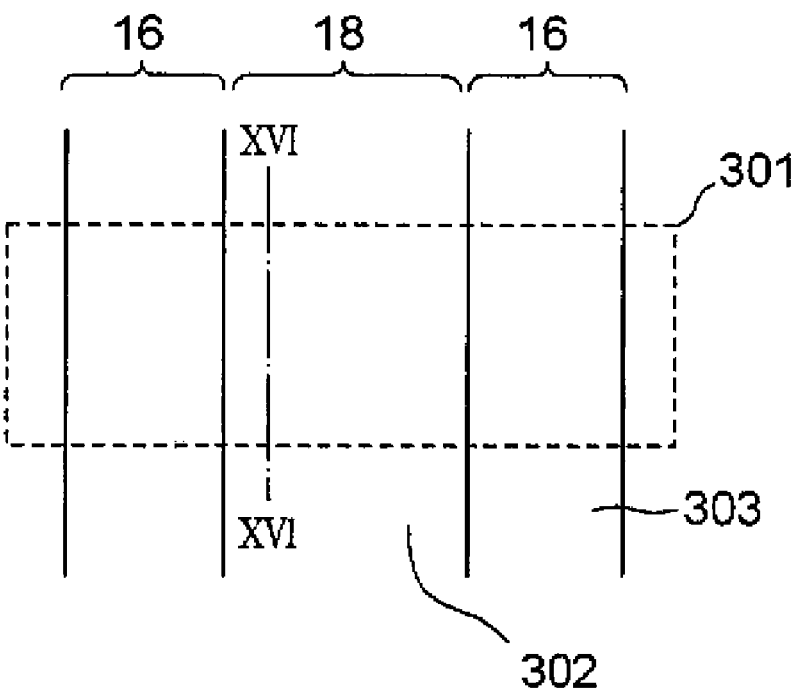
[ 2 ]
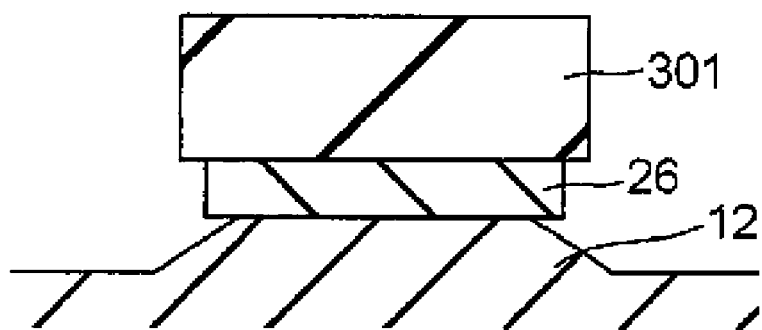

FIG. 17
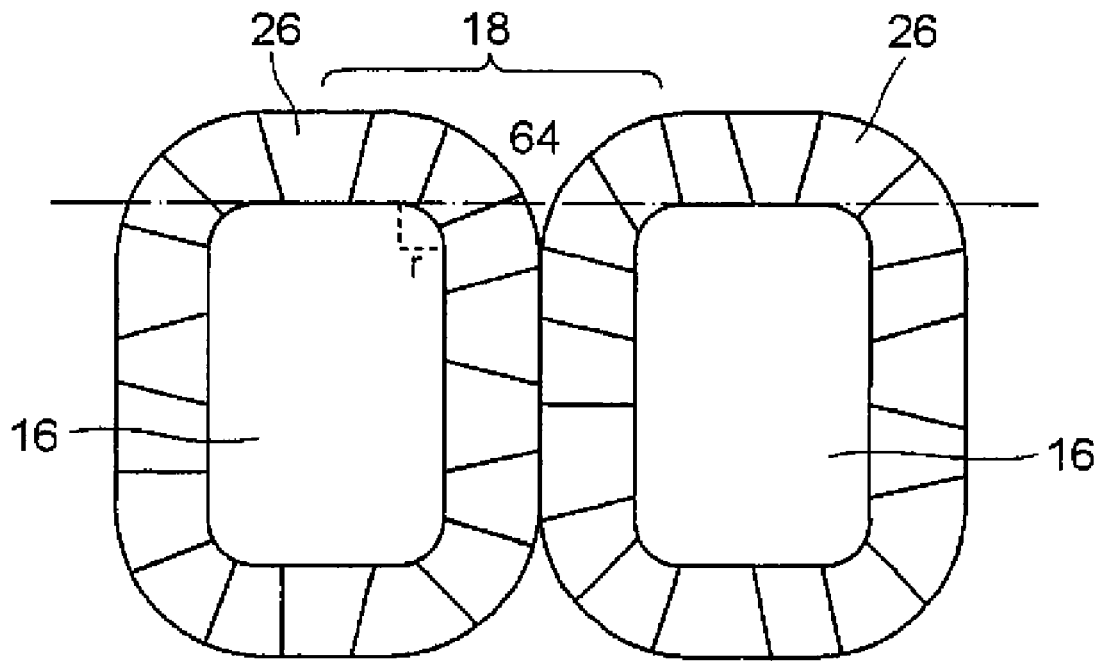
[2]
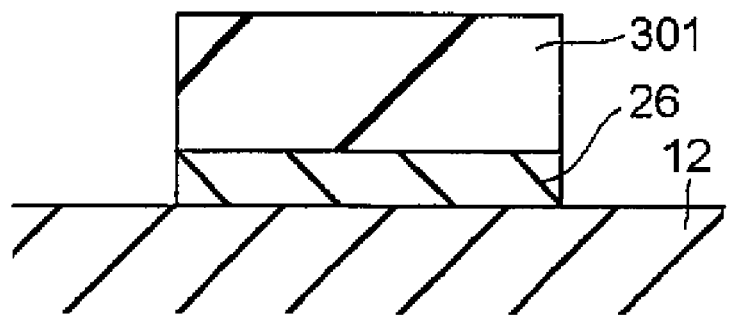

FIG. 18
[ 1 ]
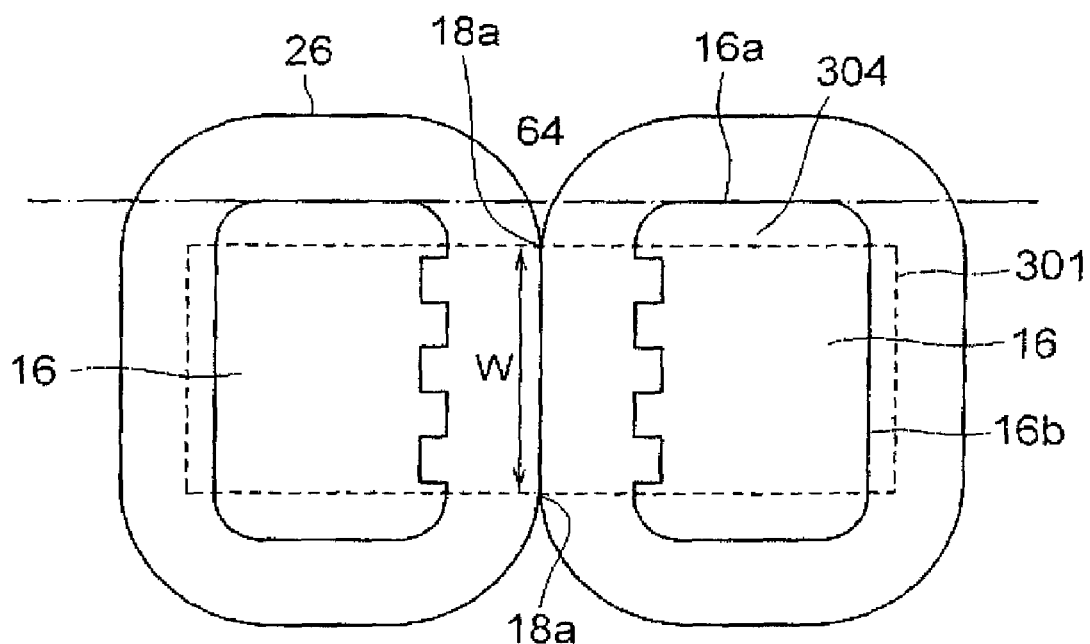
[ 2 ]
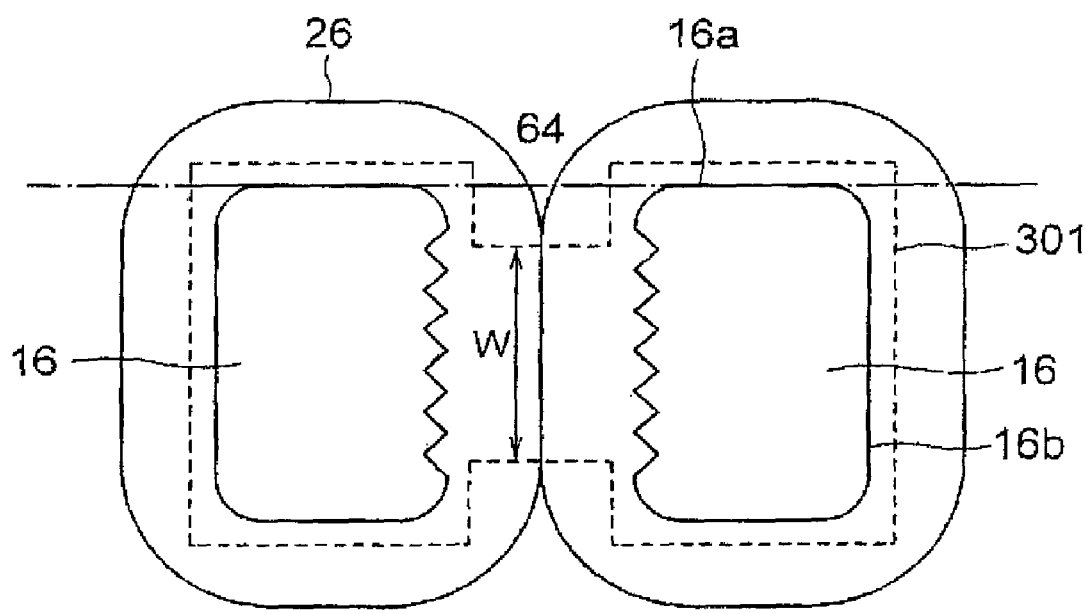

METHOD OF MANUFACTURING A POLYCRYSTALLINE SEMICONDUCTOR THIN FILM

TECHNICAL FIELD

The present invention relates to, for example, a thin film transistor used for an active matrix type display and a method of manufacturing a polycrystalline semiconductor thin film.

Hereinafter, a thin film transistor is indicated as "TFT", and silicon is indicated as "Si".

BACKGROUND ART

In recent years, a polycrystalline Si TFT has been developed increasingly as a thin film element forming an integrated circuit on a glass substrate. As a method of forming a polycrystalline Si thin film, there is typically used an excimer laser method in which an amorphous Si film is first formed and then an excimer laser beam is irradiated, whereby the amorphous Si film is melted and recrystallized so as to obtain a polycrystalline Si film. As a laser annealing device used in the excimer laser method, a device in which a laser beam having the irradiation aperture of about 300 mm by 0.4 mm is scan-irradiated in several 10 µm pitches in a short axial direction thereof is marketed. With this laser annealing device, it is possible to form a polycrystalline Si film in which crystal grains of sub µm order are arranged at random. Therefore, TFTs having the mobility of about 150 $cm^2$/Vs can be mass-produced with fine yield. Further, in order to make high-performance TFTs in the future, it is required to enlarge crystal grain diameter and position control of the crystal grain.

Techniques for enlarging the grain diameter of a polycrystalline Si film are disclosed in, for example, Japanese Patent Publication No. 2689596, Japanese Patent Application Laid-open No. 8-71780, Japanese Patent Laid-open No. 11-274095, MRS Bulletin, Vol. 21 (1996), March Edition, and the 61st National Convention of the Japan Society of Applied Physics, proceedings (2000), No. 2.

The technique for enlarging the grain diameter of a polycrystalline Si film, disclosed in Japanese Patent Publication No. 2689596, is to enlarge the grain diameter of a thin film part by using an amorphous Si film of two layers. However, in this technique for enlarging the grain diameter, there is no description or suggestion relating to the molten state of the film and the film structure other than the film thickness. Further, there is no description or suggestion relating to the position control of crystal grains.

On the other hand, there has been developed a pseudo single crystal Si TFT by forming a crystal grain of several µm equivalent to the channel length of a TFT while controlling the laser irradiating position.

For example, the MRS Bulletin, Vol. 21 (1996) mentioned above discloses a technique for forming a one-directional growth polycrystalline Si thin film formed of grain boundaries aligned in almost parallel by irradiating an extremely fine linear beam of 5 µm width in 0.75 µm pitches on an amorphous Si thin film formed in an island shape. Further, in the proceedings of the 61st National Convention of the Japan Society of Applied Physics (2000), there is disclosed a technique for forming a Si crystal grain grown to about 3 µm corresponding to the beam irradiation position by creating a laser beam having intensity cycles of µm order using a phase shift mask.

When crystal grain positions are controlled by the laser irradiation positions as described above, it is required to align the crystal grains obtained and the TFT channel region with high precision in TFT formation. Therefore, as disclosed in the proceedings of the 61st National Convention of the Japan Society of Applied Physics (2000), there is caused a need to provide an alignment mark for a stepper on a substrate, and to provide a camera for reading the mark on the laser irradiation device.

However, with such a camera, a problem of a laser irradiation device becoming complicated and larger is caused. In particular, a glass substrate for LCD is as large as 1 m square or so, currently. Therefore, if an additional chamber for reading the mark is provided besides annealing, the occupied area of the device increases significantly. Further, for aligning the substrate, θ correction is needed in addition to two axes of X and Y, so there is a need of a complicated stage enabling precise operation for fine adjustment. Such a device may cause an increase in cost and a decrease in working efficiency. Further, since reading of a substrate mark and alignment take time, throughput in the annealing step drops.

Further, when a phase shift mask is used, the mask must be closely attached substantially on the surface of amorphous Si, so Si atoms released from the surface of the amorphous Si film during laser annealing contaminate the mask. Therefore, expensive masks must be replaced frequently. This causes problems that the price of a laser annealing device as a manufacturing equipment becomes expensive and the working efficiency of the device is lowered.

An object of the present invention is to provide, for example, a thin film transistor and a method of manufacturing a polycrystalline semiconductor thin film, capable of easily realizing performances such as a low threshold voltage, high carrier mobility and a low leak current. In other words, an object of the present invention is to provide, for example, a thin film transistor having a channel region which is position-controlled and method of manufacturing a polycrystalline semiconductor thin film, without using an expensive and complicated laser irradiation device.

DISCLOSURE OF THE INVENTION

In order to achieve the object described above, a thin film transistor according to the present invention comprises a polycrystalline semiconductor thin film including a large heat capacity part having a large heat capacity and a small heat capacity part having a small heat capacity, in which the small heat capacity part is used at least as a channel part. The polycrystalline semiconductor thin film is formed of a crystal grain film by laser annealing of an energy density with which the small heat capacity part melts completely but the large heat capacity part does not melt completely.

Here, the energy density causing complete melting means an energy density not less than a microcrystallization threshold. The crystal grain diameter of a polycrystalline semiconductor film obtained by laser annealing an amorphous semiconductor film depends on the energy density of the laser. It is known that although the crystal grain diameter of the crystal-grown semiconductor film increases as the energy density increases, when the energy density exceeds a specific value, the crystal grain diameter becomes extremely small (e.g., 20 nm or less for Si). However, depending on the film thickness, it may be amorphized without being crystallized after melted by a laser irradiation. The energy density of this value is called a microcrystallization threshold.

Microcrystallization is considered to be caused that when the molten state of an amorphous semiconductor film changes from incomplete melting to complete melting, the nucleation mechanism at the time of recrystallization changes heterogeneous nucleation where the interface between the substrate and the amorphous semiconductor film serves as a nucleation site into homogeneous nucleation where no unique nucleation site exists. The change in the nucleation mechanism depends on attained temperature of the interface between the substrate and the amorphous semiconductor film, the temperature distribution in a film thickness direction, cooling rate of the film, and the like. Therefore, the microcrystallization threshold changes depending on the film thickness of an amorphous semiconductor film, the structure of the amorphous semiconductor film, the optical constant of the amorphous semiconductor film, wavelength and pulse width of a pulse laser beam, and the like. For example, the microcrystallization threshold of a polycrystalline Si film which has been laser annealed once shows a value of about 14% greater than that of an amorphous Si film before laser irradiation. Further, when the energy density increases further, film destruction is caused due to ablation.

When laser annealing of an energy density with which a small heat capacity part melts completely but a large heat capacity part does not melt completely is performed, the temperature of the large heat capacity part becomes not more than the microcrystallization threshold. Therefore, in the large heat capacity part, the interface between the substrate and the amorphous semiconductor film serves as a main nucleation site, whereby crystal grows from the interface between the substrate and the amorphous semiconductor film in an amorphous semiconductor surface direction. On the other hand, since the small heat capacity part melted completely, a nucleation on the interface between the substrate and the amorphous semiconductor film is suppressed. Therefore, a crystal grain which has been crystal-grown in the large heat capacity part serves as a seed crystal which grows from the boundary between the large heat capacity part and the small heat capacity part in a lateral direction (film face direction) to the small heat capacity part. Consequently, a crystal grain of a large grain diameter (large crystal grain) is obtained.

Here, if the energy density is too high so that the large heat capacity part also melts completely as well as the small heat capacity part, micro-crystallized tissues are grown in both of the small heat capacity part and the large heat capacity part. In contrast, if the energy density is too low so that melting of the large heat capacity part is not enough, the amorphous semiconductor film region remains near the interface between the substrate and the amorphous semiconductor film. In such a case, the seed crystal is formed on the small heat capacity part side than the interface between the small heat capacity part and the large heat capacity part, so the grain diameter of the large crystal grain becomes small. Further, if the energy density is too low so that the small heat capacity part does not melt completely, a nucleation is caused on the interface between the substrate and the amorphous semiconductor film, so heterogeneous crystal grains (e.g., less than 1 μm for Si) are formed, which are generated at random in the large heat capacity part and in the small heat capacity part.

Accordingly, such a condition is selected that the irradiation energy density is not less than a microcrystallization threshold and less than an ablation threshold in the small heat capacity part, and not less than a value at which the amorphous semiconductor film is completely polycrystallized in a film thickness direction and less than the microcrystallization threshold in the large heat capacity part.

Therefore, as for energy densities of laser annealing in the present invention, an energy density with which the small heat capacity part melts completely is one not less than the microcrystallization threshold but less than the ablation threshold in the small heat capacity part, an energy density with which the large heat capacity part does not melt completely is one not less than the polycrystallization threshold but less than the microcrystallization threshold of the large heat capacity part. Further, as an energy density of laser annealing in the present invention, an energy density with which the small heat capacity part melts completely may be one not less than the microcrystallization threshold of the small heat capacity part, and an energy density with which the large heat capacity part does not melt completely may be one less than the microcrystallization threshold of the large heat capacity part.

Further, the TFT of the present invention may be so configured that the small heat capacity part is formed to be interposed between two large heat capacity parts, and distances between the two large heat capacity parts are different depending on positions.

A small heat capacity part forms boundaries with each large heat capacity part. Large crystal grains grow from the boundaries to the inside of the small heat capacity part, and the face at which the large crystal grains collide with each other becomes a grain boundary. If distances between the two large heat capacity parts sandwiching the small heat capacity part are constant at any position, two boundaries between the large heat capacity parts and the small heat capacity part are in parallel, so the crystal grain boundaries are formed at positions of the same distance from the two boundaries. That is, the positions of the crystal grain boundaries are controlled in one dimension. In contrast, if distances between the large heat capacity parts are different depending on positions, the two boundaries between the large heat capacity parts and the small heat capacity part are not in parallel, so the crystal grain boundaries are formed at complex positions. That is, positions of the crystal grain boundaries are controlled in two dimensions.

Further, the film thickness of the large heat capacity part of the polycrystalline semiconductor thin film is made thick, and the film thickness of the small heat capacity part of the polycrystalline semiconductor thin film is made thin. Alternatively, a lower layer film is formed solely on a substrate of a region, of the large heat capacity part, where the semiconductor thin film is formed.

When a laser beam of a certain energy density is irradiated to a semiconductor thin film having the structure described above, in a part of thick film thickness or a part with a lower layer film, the energy amount per unit mass is small for example, whereby the temperature is less likely to rise, so it forms a large heat capacity part. On the other hand, in a part of thin film thickness or a part without a lower layer film, the energy amount per unit mass is large for example, whereby the temperature is likely to rise, so it forms a small heat capacity part.

The lower layer film is formed of a material having a large heat capacity such as a metal film, a silicide metal film or a nitride metal film. When the small heat capacity part is interposed between the large heat capacity parts, crystal grains of large diameter (large crystal grains) grown from the boundaries between the large heat capacity parts and the small heat capacity part to the small heat capacity part side are obtained. A channel part is formed in the rows of the large crystal grains. The small heat capacity part may be interposed between the two large heat capacity parts, and large crystal grains in two rows may be provided, which are grown from the boundaries between the large heat capacity parts and the small heat capacity part to the small heat capacity part side to thereby contact each other. By forming a channel part in each of the two rows, a double gate structure is realized. The small heat capacity part may be so configured as to include a region consisting of crystal grains of large diameter and a region consisting of crystal grains of fine diameter. In the area including crystal grains of fine diameter, an impurity introduction region is formed. In this case, the impurity introduction region is formed as a low-concentration impurity introduction region.

A thin film transistor according to the present invention includes a TFT of a low threshold voltage, and a TFT of an intermediate threshold voltage in which a polycrystalline film or a microcrystalline film is used as a channel part, provided on the same substrate. Further, a TFT of a low threshold voltage consisting of a TFT according to the present invention, a TFT of an intermediate threshold voltage in which a polycrystalline film or a microcrystalline film is used as a channel part, and a TFT of a high threshold voltage in which an amorphous film is used as a channel part, may be provided on the same substrate. Further, a thin film integrated circuit may be formed by using TFTs having different threshold voltages.

A method of manufacturing a polycrystalline semiconductor thin film according to the present invention comprises: a semiconductor film forming step in which a non-single crystalline semiconductor thin film including a large heat capacity part having a large heat capacity and a small heat capacity part having a small heat capacity is formed on a substrate; and an annealing step in which a laser beam of an energy density with which the small heat capacity part melts completely but the large heat capacity part does not melt completely is irradiated to the non-single crystalline semiconductor thin film. In the annealing step, it is desirable that the laser beam be a pulse laser beam of a spot diameter processed to be in a linear shape having a short axis and a long axis, and that the laser beam be irradiated while being moved sequentially in a short axial direction with a moving distance not more than the grain diameter of the polycrystalline semiconductor thin film in the short axial direction. When the non-single crystalline semiconductor thin film is formed, the small heat capacity part is interposed between the two large heat capacity parts, and distances between the large heat capacity parts are made different depending on positions. It is also possible that the large heat capacity part exists only in a part of a region to which the laser beam is irradiated.

A thin film transistor substrate according to the present invention may be incorporated in a liquid crystal display device, an organic EL display device, a mobile telephone, a personal digital assistance or an electronic apparatus.

Further, the present invention may be changed to have the following configuration.

That is, the present invention comprises a polycrystalline semiconductor thin film having regions of different heat capacities, includes large heat capacity parts facing each other and a small heat capacity part interposed therebetween. The small heat capacity part is used at least as a channel part, and the polycrystalline semiconductor thin film is formed of crystal grain films by laser annealing of an energy density with which the small heat capacity part melts completely but the large heat capacity parts do not melt completely, and distances between the large heat capacity parts differ.

Further, the present invention may have such a configuration that it comprises a polycrystalline semiconductor thin film having ranges of different heat capacities, the small heat capacity part is used at least as a channel part, the large heat capacity part is formed by the polycrystalline semiconductor thin film contacting a metal film, a silicide metal film, a nitride metal film or the like, and the polycrystalline semiconductor thin film is formed of crystal grain films by laser annealing of an energy density with which the small heat capacity part melts completely but the large heat capacity part does not melt completely.

Further, the present invention may have such a configuration that it comprises a polycrystalline semiconductor thin film having regions of different heat capacities, the small heat capacity part is used at least a channel part, and the polycrystalline semiconductor thin film is formed of crystal grain films by laser annealing of an energy density with which the small heat capacity part melts completely but the large heat capacity part does not melt completely.

Further, the present invention may have such a configuration including rows of large crystal grains grown from the boundaries between the large heat capacity parts and the small heat capacity part to the small heat capacity part side. In the small heat capacity part, microcrystal grains may be formed in a region adjacent the large crystal grain rows.

Further, a TFT of the present invention may have a double gate structure.

A TFT substrate of the present invention includes a low threshold voltage TFT in which only large crystal grain rows are used as a channel part, and an intermediate threshold voltage TFT in which regions other than the large crystal grain rows are used as a channel part.

Further, a TFT substrate of the present invention may have a high threshold voltage TFT in which an amorphous semiconductor is used as an active layer, in addition to the low threshold voltage TFT and the intermediate threshold voltage TFT.

Further, a TFT substrate of the present invention may have a thin film integrated circuit consisting of the TFTs having different threshold voltages.

An electronic apparatus of the present invention is characterized as to include the above-described TFT substrate. Such an electronic apparatus may be a liquid crystal display device, an organic EL display device, a mobile telephone or a personal digital assistance.

A method of manufacturing a polycrystalline semiconductor thin film of the present invention is to irradiate, to a non-single crystalline semiconductor thin film having regions of different heat capacity parts, a pulse laser beam processed in a linear shape of an energy density with which a small heat capacity part melts completely but the large heat capacity part does not melt completely, to thereby form large crystal grains which are position-controlled in the small heat capacity part. In the manufacturing method, it is possible to have a configuration in which the pulse laser beam is irradiated while being moved sequentially in a short axial direction with a moving distance not more than the grain diameter in the short axial direction of the laser bean of the large crystal grain.

Further, the present invention may include large heat capacity parts facing each other, and the distance between the large heat capacity parts facing each other may change within the laser irradiation range. Further, the large heat capacity part may exist in a part of the laser irradiation range.

Further, the present invention may have such a configuration that an end part in a channel width direction of the channel part formed in the small heat capacity part does not protrude outside from an end part in a channel width direction of the large heat capacity part.

With this configuration, the channel region consisting of the large crystal grains will not be over-etched at the time of etching, so it is possible to provide a thin film transistor having a threshold voltage of a designed value.

BRIEF DESCRIPTION OF THE DRAWINGS

FIG. 1 is a sectional view showing a first embodiment of the present invention, in which a manufacturing step proceeds in sequence from FIG. 1 to FIG. 1.

FIG. 2 is a plan view showing the first embodiment of the present invention, in which the manufacturing step proceeds in sequence from FIG. 2 to FIG. 2.

FIG. 4 is a sectional view showing a TFT manufacturing step continued from FIG. 1, in which FIG. 4 shows a first example, FIG. 4 shows a second example, and FIG. 4 shows a third example.

FIG. 5 is a sectional view showing a TFT manufacturing step continued from FIG. 4. FIG. 5 and FIG. 5 are sectional views respectively showing the TFT at intermediate threshold voltages.

FIG. 6 is a sectional view showing a second embodiment of the present invention, in which a manufacturing step proceeds in sequence from FIG. 6 to FIG. 6.

FIG. 7 is a plan view showing a third embodiment of the present invention, in which a manufacturing step proceeds in sequence from FIG. 7 to FIG. 7.

FIG. 8 is a plan view showing a conventional example, in which a manufacturing step proceeds in sequence from FIG. 8 to FIG. 8.

FIG. 9 is a plan view showing a fourth embodiment of the present invention, in which a manufacturing step proceeds in sequence from FIG. 9 to FIG. 9.

FIG. 10 is a plan view showing the boundary between a large heat capacity part and a small heat capacity part in a first example of the present invention, in which FIG. 10 shows a first example, FIG. 10 shows a second example and FIG. 10 shows a third example.

FIG. 11 is a sectional view showing a second example of the present invention, in which FIG. 11 shows a first manufacturing step, FIG. 11 shows a first example of a second manufacturing step, and FIG. 11 shows a second example of the second manufacturing step.

FIG. 13 is a sectional view showing the third example of the present invention (No. 2), in which a manufacturing step proceeds in sequence from FIG. 13 to FIG. 13.

FIG. 14 shows a fifth embodiment of the present invention, in which FIG. 14 is a block diagram, and FIG. 14 is an outside view.

FIG. 15 shows a sixth embodiment of the present invention, in which FIG. 15 is a block diagram, and FIG. 15 is an outside view.

FIG. 16 shows a comparative example of the present invention, in which FIG. 16 is a plan view, and FIG. 16 is a sectional view taken along the line XVI-XVI of FIG. 16.

FIG. 17 shows a seventh embodiment of the present invention, in which FIG. 17 is a plan view, and FIG. 17 is a sectional view showing that over-etching of a large crystal grain is avoided.

FIG. 18 further shows the seventh embodiment of the present invention, in which FIGS. 18[1] and 18[2] are plan views.

BEST MODE FOR CARRYING OUT THE INVENTION

Figure 3:
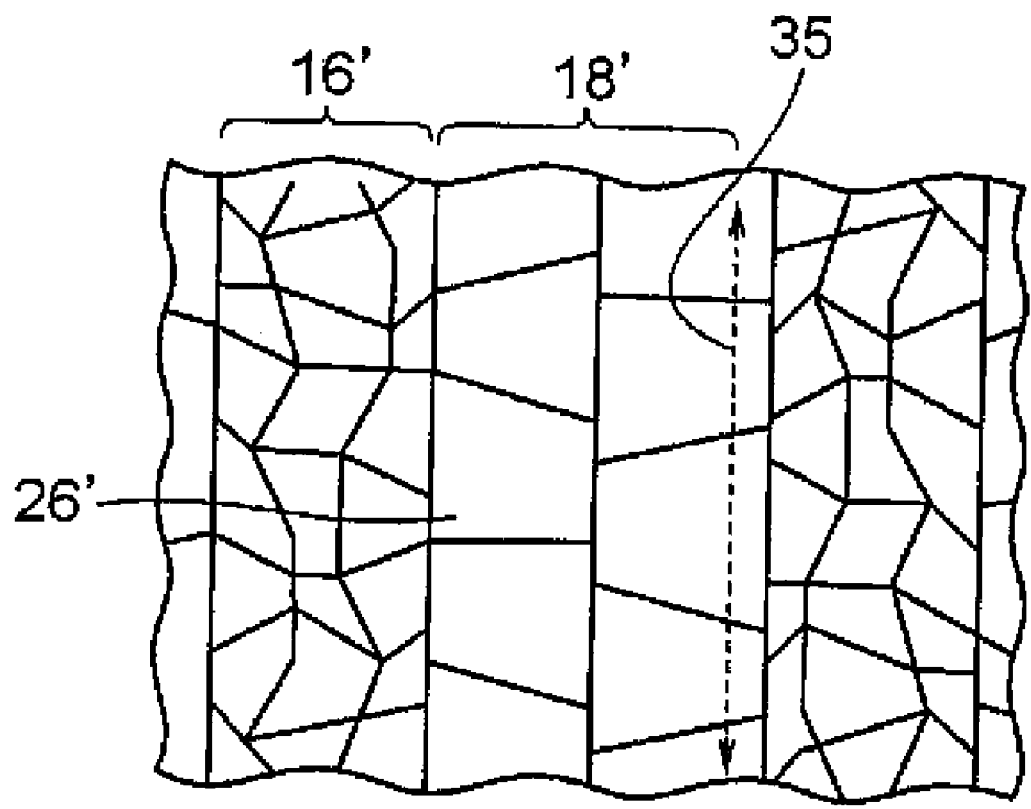
FIG. 3 is a plan view showing a comparative example of the present invention.

Hereinafter, embodiments of the present invention will be explained in detail based on the drawings.

First Embodiment

An embodiment of the present invention shown in FIGS. 1 and 2 is characterized in that the film thickness of a semiconductor thin film is made to be varied so as to form a polycrystalline crystal grain film.

First, on an insulating substrate 12, an amorphous Si film 14 is deposited (FIG. 1, FIG. 2). Then, patterning is performed to the amorphous Si film 14 by using a photoresist (PR) method and a dry etching (DE) method so as to change the film thickness of the amorphous Si film 14 to thereby form large heat capacity parts 16 and a small heat capacity part 18 as regions having different heat capacities. At this time, a boundary between the large heat capacity part 16 and the small heat capacity part 18 is formed to have a rectangle wavy form viewed from the surface (FIG. 1, FIG. 2). Therefore, the distances D1 and D2 between the large heat capacity parts 16 facing each other across the small heat capacity part 18 are not constant.

Next, an excimer laser beam 20 is irradiated to the amorphous Si film 14. The energy density of the excimer laser beam 20 is set to one in which the small heat capacity part 18 melts completely but the large heat capacity parts 16 do not melt completely. As a result, large crystal grains 26 grow from the boundaries between the large heat capacity parts 16 and the small heat capacity part 18 to the small heat capacity part 18 side so as to be formed in the rows with fine positioning control (FIGS. 1[3], 1[4]).

Here, an energy density causing complete melting means one not less than a microcrystallization threshold. In laser annealing of an amorphous Si film, the crystal grain diameter of a polycrystalline Si film formed depends on the energy density of the laser (e.g., Japanese Patent Application Laid-open No. 11-274095). That is, it has been known that the crystal grain diameter becomes larger as the energy density increases but it becomes extremely small of 20 nm or less when the energy density exceeds a particular level (it may not be crystallized but be amorphized after melted by the laser irradiation depending on the film thickness). The energy density of this time is called a microcrystallization threshold.

When the molten state of the thin film is changed from incomplete meting to complete melting, the nucleation mechanism at the time of recrystallization is changed from heterogeneous nucleation where the interface between the substrate and the Si film is the nucleation site to a homogeneous nucleation without a unique nucleation site. Thereby, it is considered that the microcrystallization is caused. Further, when complete melting occurs, the nucleation on the interface between the substrate and the Si film is suppressed, whereby the incubation time for nucleation becomes extremely long.

The change of the nucleation mechanism depends on the achieved temperature at the interface between the substrate and the thin film, the temperature distribution in a film thickness direction, the cooling speed of the film and the like. Therefore, the microcrystallization threshold changes depending on the film thickness of the thin film, the structure of the thin film, the optical constant of the thin film, the wavelength of the pulse laser beam, the pulse width and the like. For example, a threshold for microcrystallization of the polycrystalline Si film, laser-annealed once, shows a value which is 14% larger than the amorphous Si film before laser irradiation. Further, as the energy density increases, film separation is caused due to ablation.

In the present embodiment, a mechanism for forming the large crystal grains 26 in the small heat capacity unit 18 without causing microcrystallization all over the small heat capacity unit 18 is due to a fact that the large heat capacity parts 16 exist. That is, the large heat capacity parts 16 are irradiated with the energy density of not more than the microcrystallizaiton threshold, so the substrate/Si interface becomes a main nucleation site 22. On the other hand, since the small heat capacity part 18 melted completely, nucleation on the substrate/Si interface is suppressed. Therefore, the nucleation site 24 formed in the large heat capacity part 16 works as a seed crystal, so that the large crystal grain 26 grown in the lateral direction (film face direction) of the small heat capacity part 18 is obtained. By selecting a distance between the large heat capacity parts 16 facing each other across the small heat capacity part 18, large crystal grains 26 are formed linearly so as to divide the small heat capacity part 18 into two (FIG. 1, [4]). At this time, at the crystal growth ends of the large crystal grains 26 in two rows, a grain boundary 34 almost vertical in a channel direction is formed.

Here, if the energy density is less than the threshold of microcrystallization of the small heat capacity part 18, small crystal grains which are nucleus-generated from the substrate/Si interface are formed even in the small heat capacity part 18. On the other hand, if the energy density is not less than the threshold of microcrystallization of the large heat capacity part 16, both of the large heat capacity parts 16 and the small heat capacity part 18 are micro-crystallized.

Further, in the present embodiment, the distance between the large heat capacity parts 16 facing each other across the small heat capacity part 18 is not constant, as shown in FIG. 2. Regions corresponding to the distances are defined as a short distance region 28 and a long distance region 30. Therefore, the large crystal grains 26 in two rows which are crystal-grown from different directions collide with each other at a point where the small heat capacity part 18 is divided in two parts in the short distance region 28 first, to thereby stop the growth, and the grain boundary 34 is formed at the crystal growth ends. At this time, the large crystal grains 26 in two rows which are crystal-grown from different directions do not reach the point where the small heat capacity part 18 is divided in two parts in the long distance region 30, whereby a melt 32 remains (FIG. 2). As time passes, the large crystal grains 26 in the long distance region 30 grow so as to fill the remaining area of the melt 32. Then, the crystal growth ends of the large crystal grains 26 in two rows collide with each other, whereby the grain boundary 34 is formed similarly (FIG. 2).

The TFT of the present embodiment consists of a polycrystalline Si film 36 having the small heat capacity part 18 of thin film thickness and the large heat capacity parts 16 of thick film thickness, in which the small heat capacity part 18 with thin film thickness is used at least as a channel part. The polycrystalline Si film 36 is formed of crystal grain films by laser annealing of an energy density with which the small heat capacity part 18 melts completely but the large heat capacity parts 16 do not melt completely. Since the channel part is formed of the linear large crystal grains 26 which are grown from the boundaries between the small heat capacity part 18 and the large heat capacity parts 16, it is possible to easily realize characteristics such as a low threshold voltage value, high carrier mobility and low leak current by using a typical laser annealing device.

FIG. 3 is a plan view showing a comparative example of the present invention. Hereinafter, explanation will be given based on FIGS. 2 and 3.

As described above, the present embodiment is capable of forming the large crystal grains 26 by position-controlling them in two dimensions. On the other hand, this comparative example is a case where the distance between large heat capacity parts 16' across the small heat capacity part is constant. In this case, the position-control of the large crystal grains 26' is possible, but the control is limited to one dimension, so control of the crystal grain positions in the arrow 35 direction is impossible. Whether the control of the large crystal grains 26 is performed in one dimension or two dimensions can be selected while considering the required performance of the TFT and its uniformity, and the patterning accuracy, the uniformity, the reproducibility and the like of the TFT manufacturing step.

FIG. 4 is a sectional view showing a TFT manufacturing step continued from FIG. 1. FIG. 4 shows a first example, FIG. 4 shows a second example and FIG. 4 shows a third example. Hereinafter, explanation will be given based on FIGS. 1 and 4.

Following the step shown in FIG. 1, the polycrystalline Si film 36 consisting of the large crystal grains 26 is patterned, a gate insulating film 37 is deposited, and a gate electrode 38 is formed only on the polycrystalline Si film 36 formed of the large crystal grains 26 in the small heat capacity part 18, via the gate insulating film 37 (FIG. 4).

The position of the polycrystalline Si film 36 consisting of the large crystal grains 26 in the small heat capacity part 18 depends not on a laser irradiation position but on the position of the large heat capacity parts 16 using the PR method. Therefore, in the TFT formation, it is possible to easily align the position of the polycrystalline Si film 36 consisting of the large crystal grains 26 in the small heat capacity part 18 and the position of the gate electrode 38 with high accuracy by using a stepper, without using a special laser annealing device. The position of the gate electrode 38 determines the position of the channel region 39.

The large crystal grains 26 are formed in two rows sandwiching the grain boundary 34. A TFT shown in FIG. 4 is one in which the gate electrode 38 (channel region 39) is formed over the two large crystal grains 26 in the small heat capacity part 18, and characteristics of low mobility and a high threshold voltage are obtained. A TFT shown in FIG. 4 is one in which a gate electrode 40 (channel region 41) is formed only on the polycrystalline Si film 36 consisting of one large crystal grain 26 in the small heat capacity part 18, and characteristics of high mobility and a low threshold voltage are obtained. A TFT shown in FIG. 4 is one in which gate electrodes 42*a* and 42*b* (channel regions 43*a* and 43*b*) are formed on the respective polycrystalline Si films 36 consisting of two large crystal grains 26 in the small heat capacity part 18, and characteristics of high mobility and a low threshold voltage are obtained. Note that the "low mobility and high threshold voltage" mentioned here means a case where it is compared with a pseudo single crystalline TFT according to the present invention, so high performance can be achieved when comparing with that of conventional art.

As described above, plural types of TFT characteristics different in the mobility and threshold voltages can be obtained by combining the grain diameter of the large crystal grain 26 and the required channel length. The TFT shown in FIG. 4 is controlled such that the grain boundary 34 forms one plane (a plane with respect to a channel length direction). The TFT shown in FIG. 4 is a pseudo single crystalline TFT which is without the grain boundary 34 almost perpendicular to the channel length direction, and has characteristics of high mobility and a low threshold voltage. The TFT shown in FIG. 4 is a pseudo single crystalline TFT which is without the grain boundary 34 almost perpendicular to the channel length direction, and is a pseudo single crystalline TFT of a double gate structure in which channel parts are formed corresponding to the respective large crystal grains 26 formed in two rows.

FIG. 5 is a sectional view showing a TFT manufacturing step continued from the step shown in FIG. 4. FIG. 5 and FIG. 5 are sectional views respectively showing the TFT at intermediate threshold voltages. Hereinafter, explanation will be given based on FIGS. 4 and 5.

Following the step shown in FIG. 4, a source/drain region 46 is formed by introducing an impurity. Here, an LDD region may be formed, if required. Then, an inter-layer insulating film 47 is deposited, and a contact hole 48 is opened, and a source/drain electrode 49 is formed, whereby the TFT is completely formed (FIG. 5).

Further, in the TFT shown in FIG. 5, a small grain diameter region 50 is used as a channel part by providing a gate electrode 52 on the small grain diameter region 50 in the large heat capacity part 16. In this case, the crystal grain diameter of the small grain diameter region 50 is smaller than the grain diameter of the large crystal grain 26 described above. This is because the film thickness is large and the heat capacity is large in the large heat capacity part 16, so the crystal growth is suppressed whereby the crystal grain diameter becomes small.

In the TFT shown in FIG. 5, a gate electrode 56 is provided on the micro-crystallized region 54 of the small heat capacity part 18, and the micro-crystallized region 54 is used as a channel part.

In this case, the crystal grain diameter of the micro-crystallized region 54 is smaller than the grain diameter of the small grain diameter region 50 described above. This is because the film thickness of the small heat capacity part 18 is thin, the heat capacity is small and there is no large heat capacity part 16 that forms a boundary with the small heat capacity part 18 is formed. Therefore, the large crystal grain formed in the large heat capacity part 16 will not crystal-grow toward the small heat capacity part 18, and further the crystal grain diameter is made fine in the small heat capacity part 18.

Hereinafter, a large crystal grain means a crystal grain formed by a melting difference between complete melting and incomplete melting in the present invention. Further, a small crystal grain means a crystal grain formed in incomplete melting, and in particular, it means a crystal grain formed in the large heat capacity part 16. Further, a fine crystal grain means a crystal grain formed in complete melting under homogeneous nucleation. These crystal grains have the following grain diameter relationship, that is, grain diameter of large crystal grain>grain diameter of small crystal grain>grain diameter of fine crystal grain.

These TFTs show a characteristic of higher threshold voltage comparing with a high performance TFT in which the large crystal grains 26 of FIG. 5 are used as the channel part. Therefore, by changing the arrangement of the large heat capacity part 18, it is possible to easily form TFTs of plural kinds having different threshold voltages on the same substrate.

By using plural types of TFTs having different threshold voltages, it is possible to form a TFT substrate with thin film integrated circuits such as a level shift circuit and a power supply boosting circuit. By using the TFT substrate, it is possible to form a low power consumption electronic apparatus in which a high operating voltage is obtained by inputting a low power supply voltage. Further, depending on electronic apparatus, it is possible to obtain a TFT substrate on which an amorphous Si TFT with high threshold voltage is also formed, by using a region where the amorphous Si film remains as it is without irradiating a laser beam.

In particular, when a Si film is made thinner not more than 30 nm, the step yield is tend to deteriorate due to the Si film is pierced in the step of etching a contact hole. On the other hand, in the case of present embodiment, Si film will not be pierced by etching due to the large capacity part 16 made thicker, which can improve the yield.

Second Embodiment

A second embodiment of the present invention will be explained based on FIG. 6. The embodiment of the present invention shown in FIG. 6 uses a lower layer film having a large heat capacity so as to provide a heat capacity difference to a semiconductor thin film. A specific explanation will be given below.

A metal film 58 is deposited on an insulating substrate 12 (FIG. 6). The metal film 58 is preferably made of high-melting metal such as W, Ti or Ta, used in a typical semiconductor manufacturing process. It may be silicide or nitride of the high-melting metal. Then, the metal film 58 is patterned, and the patterned metal film 58 is used as a lower layer film (FIG. 6).

Then, the amorphous Si film 14 is deposited (FIG. 6). As a result, a region contacting the metal film 58 serves as a large heat capacity part 16, and the remaining region serves as a small heat capacity part 18. Then, an excimer laser beam is irradiated to the amorphous Si film 14. The energy density of the laser beams is set to one with which the small heat capacity part 18 melts completely but the large heat capacity part 16 does not melt completely. Consequently, large crystal grains 26 are formed which are grown from the boundaries between the large hear capacity parts 16 and the small heat capacity part 18 to the small heat capacity part 18 side (FIG. 6).

Comparing with the case where regions of different heat capacities are formed due to the film thickness difference in the first embodiment, in a case where regions of different heat capacities are formed due to the fact whether the metal film 58 as a lower layer film exists or not, the grain diameter of the large crystal grain 26 tends to be enlarged. In this case, due to the cooling effect of the metal film 58, a boundary between the metal film 58 and the amorphous Si film 14 becomes a more prioritized nucleation site. Therefore, the nucleation incubation time becomes shorter in the large heat capacity part 16, and consequently, it is considered that the time different between the nucleation incubation time in the large heat capacity part 16 and the nucleation incubation time in the small heat capacity part 18 becomes larger.

Similar to the first embodiment, a TFT in which a channel part corresponds to the large crystal grain 26 can be formed with fine control in the present embodiment. If the large heat capacity part 16 is made to correspond to the source/drain layer of the TFT, it is possible to reduce the contact resistance by using the metal film 58 as a contact part with wiring.

In particular, when the Si film is formed to be 30 nm or thinner, the Si film is pierced in the step of etching the contact hole, whereby the process yield is tend to deteriorate. On the other hand, in the present embodiment, the metal film 58 serves as an etching stopper, whereby the yield will not be lowered.

Third Embodiment

A third embodiment of the present invention will be explained based on FIG. 7.

On an insulation substrate, the amorphous Si film 14 having a heat capacity difference was formed such that the large heat capacity part 16 is in a band shape (FIG. 7). Then, an excimer laser beam 60 processed to be an extremely narrow linear shape having the beam short axis width of about 10 μm or less is irradiated with such an energy density that the small heat capacity part 18 melts completely but the large hear capacity parts 16 do not melt completely. The excimer laser beam 60 is irradiated such that the long axial side across the large heat capacity part 16 and the small heat capacity part 18, and the beam width (beam short axial direction) is narrow. Therefore, together with an effect of the heat capacity difference, the large crystal grains 26 position-controlled in two dimensions are formed in the small heat capacity part 18 between the large heat capacity parts 19 (FIG. 7).

Next, the excimer laser beam 60 is scan-irradiated while moving in a beam width direction. The scanning pitch is set to be the grain diameter or smaller in the scan direction of the large crystal grain 26. As a result, the large crystal grain 26 grew in the scan direction continuously as a seed crystal, so that a continuously grown crystal grain 62 corresponding to the scan distance is formed (FIG. 7).

Here, in a conventional example where no heat capacity difference is provided in the amorphous Si film 14, a continuously grown crystal grain 63 is obtained in the scan direction as shown in FIG. 8, but the generating position thereof is uncontrollable in a long axial direction of the beam as shown in FIG. 8. Further, the crystal grain diameter (crystal grain width) in the beam long axial direction is also small. That is, in the present invention, it is possible to form the continuously grown crystal grain 62 while position-controlling it, in which the crystal grain width is enlarged, by using an amorphous Si film having a heat capacity difference.

The position of the continuously grown crystal grain 62 depends on the position of the large heat capacity part 16 using the PR method. Therefore, in the TFT formation, it is possible to easily align the position of the continuously grown crystal grain 62 and the channel position with high accuracy by using a stepper.

Fourth Embodiment

A fourth embodiment of the present invention will be explained based on FIG. 9.

On an insulating substrate, the amorphous Si film 14 having a heat capacity difference was formed (FIG. 9). The large heat capacity parts 16 are dotted only near the laser irradiation start planned position, and the width of the large heat capacity part 16 in the beam length direction becomes narrower in the scan direction. Similar to the third embodiment, scan irradiation was performed in pitches of the crystal grain diameter or less by using the excimer laser beam 60 in a narrow linear shape. This crystal grain diameter corresponds to the diameter of the scan direction of the crystal grain formed in the small heat capacity part 18 interposed between the large heat capacity parts 16. In this case, the irradiation energy density of the laser annealing is set to one with which the small heat capacity part 18 melts completely but the large heat capacity part 16 does not melt completely.

The large crystal grain 26 formed in the small heat capacity part 18 interposed between the large heat capacity parts 16 servers as a seed crystal, and grows continuously in the scan direction. At this time, by controlling the shape of the large heat capacity parts 16 and the distance between the large heat capacity parts 16, the continuously grown crystal grain 62 in which the crystal grain width is enlarged is formed, which have been grown continuously without interruption even when the large heat capacity part 16 does not exist any more during scanning. That is, by only controlling the position of the seed crystal, it is possible to obtain the continuously grown crystal grain 62 which has been position-controlled.

In order to keep the continuous growth with fine control even in a region where the large heat capacity part 16 does not exist, values of the wedge shaped angle α formed at the back end of the large heat capacity part 16 and the distance x between the large heat capacity parts 16 are particularly important. It is preferable that the back end angle α of the large heat capacity part 16 be from 30 degrees to 90 degrees, and the distance x between the large heat capacity parts 16 be a dimension within about two times of the crystal grain diameter in the beam length direction.

The position of the continuously grown crystal grain 62 is determined depending on the position of the large heat capacity part 16 using the PR method. Therefore, in the TFT formation, it is possible to easily align the position of the continuously grown crystal grain 62 and the channel position with fine accuracy by using a stepper.

In fifth and sixth embodiments, electronic apparatus is configured by using a TFT substrate according to the present invention described in the aforementioned embodiments. The TFT substrate according to the present invention includes a low threshold voltage TFT, an intermediate threshold voltage TFT, a large threshold voltage TFT and the like of the present invention. In the fifth embodiment, a mobile telephone is configured as an electronic apparatus, and in the sixth embodiment, a personal digital assistance is configured as an electronic apparatus. However, electronic apparatus is not limited to them, of course.

Fifth Embodiment

The fifth embodiment of the present invention will be explained based on FIGS. 14[1] and 14[2].

An organic EL display device 100 shown in FIG. 14 includes a signal line 101, a power supply line 102, a power supply boosting circuit 103 using low threshold voltage TFTs and intermediate threshold voltage TFTs, a data line driving circuit 104 using low threshold voltage TFTs, an amplifier circuit 105 using low threshold voltage TFTs and intermediate threshold voltage TFTs, a gate line driving circuit 106 using low threshold voltage TFTs, a level shift circuit 107 using low threshold voltage TFTs and intermediate threshold voltage TFTs, and a current mirror pixel circuit array (display area) 108 using intermediate threshold voltage TFTs.

A mobile telephone 150 shown in FIG. 14 accommodates a transmit/receive circuit, a signal processing circuit and the like, not shown, in the casing 151, and also includes the organic EL display device 100, a speaker 152, an antenna 153, switches 154, and a microphone 155, shown in FIG. 14.

Sixth Embodiment

A sixth embodiment of the present invention will be explained based on FIGS. 15[1] and 15[2].

A liquid crystal display device 200 shown in FIG. 15 includes a signal line 201, a power supply line 202, a power supply boosting circuit 203 using low threshold voltage TFTs and intermediate threshold voltage TFTs, a data line driving circuit 204 using low threshold voltage TFTs, an amplifier circuit 205 using low threshold voltage TFTs and intermediate threshold voltage TFTs, a gate line driving circuit 206 using low threshold voltage TFTs, a level shift circuit 207 using low threshold voltage TFTs and intermediate threshold voltage TFTs, and a pixel TFT array (display area) 208 using large threshold voltage TFTs.

A personal digital assistance 250 shown in FIG. 15 accommodates a transmitting/receiving circuit, a signal processing circuit and the like, not shown, in the casing 251, and also includes the liquid crystal display device 100, a pen-type inputting device 252, and switches 253, shown in FIG. 15.

EXAMPLES OF THE INVENTION

First Example

A first example based on the first embodiment of the present invention will be explained by using FIGS. 1, 2, 4, 5 and 10.

A coning 1737 glass substrate was used as an insulating substrate 12, in which a $SiO_2$ film was deposited so as to have a film thickness of 300 nm as a cover film. Then, the amorphous Si film 14 was deposited so as to have a film thickness of 70 nm by the PECVD (plasma enhanced CVD) method. Then, the amorphous Si film 14 was dehydrogenized through annealing for 10 minutes at 500° C. (FIG. 1).

Then, the amorphous Si film 14 was patterned by the PR method and the DE method, and a partial region was made to be a thin film having a film thickness of 30 nm. Thereby, a part having thick film thickness forms the large heat capacity part 16, and a part having thin film thickness forms the small heat capacity part 18. Here, the boundary between the large heat capacity part 16 and the small heat capacity part 18 was made to be a rectangle wavy shape. The distances between the large heat capacity parts 16 facing each other across the small heat capacity part 18 are set to 3 μm in the short distance region 28 and 4 μn in the long distance region 30. The length (in a film face direction) of the boundary between the large heat capacity part 16 and the small heat capacity part 18 in each region is set to 1.5 μm (FIGS. 1[2], 2[2]).

Next, an excimer laser beam was irradiated under condition of the energy density being 400 $mJ/cm^2$. This energy density was selected since the microcrystallization threshold was 370 $mJ/cm^2$ in the film thickness of 30 nm, and was 470 $mJ/cm^2$ in the film thickness of 70 nm. As a result, a nucleation site 24 was emerged near the boundary between the large heat capacity part 16 and the small heat capacity part 18, and the large crystal grain 26 grown in a lateral direction to the small heat capacity part 18 was formed by being position-controlled in two dimensions. The grain diameter in the main grain growing direction of the large crystal grain 26 was 1.5 μm in the short distance region 28 and was 2 μm in the long distance region 30, and the grain boundary 34 was formed near the center of the small heat capacity part 18 (FIG. 1, 1[4], 2[3], 2[4]).

Here, the energy density to be irradiated has a value with which the small heat capacity part 18 melts completely but the large heat capacity part 16 does not melt completely. More preferably, the energy density be not less than a value with which the film is crystallized completely in the film thickness direction in the large heat capacity part 16 and not more than a value with which ablation is caused in the small heat capacity part 18. Of course, ablation should be avoided in the small heat capacity part 18. If an amorphous phase remains in the large heat capacity part 16, the nucleation site 24 of the large crystal grain 26 is pushed from the boundary position between the large heat capacity part 16 and the small heat capacity part 18 to the side nearer the small heat capacity part 18. Thereby, the grain diameter of the large crystal grain 26 decreases. Therefore, when a heat capacity difference is made by the film thickness difference, it is difficult to select an appropriate energy density if the film thickness difference is too large. It is preferable that an appropriate film thickness ratio be about 1:1.5 to 1:8. Taking into account the stability of the energy density considered from the stability of the excimer light source, the film thickness ratio of 1:1.8 to 1.6 is more desirable.

Note that it is possible to grow a crystal grain of a certain size although the small heat capacity part 18 does not melt completely. For example, in a case of 340 $mJ/cm^2$, a crystal grain having a diameter of 0.6 μm was grown. However, the grain diameter was small and the arrangement was irregular comparing with the case of complete melting, and further the position of the grain boundary 34 is also irregular. The grain diameter of the large crystal grain 26 in the present example is 1.5 μm or more, and the grain boundary 34 is controlled at a center position of the small heat capacity part 18.

Figure 10:
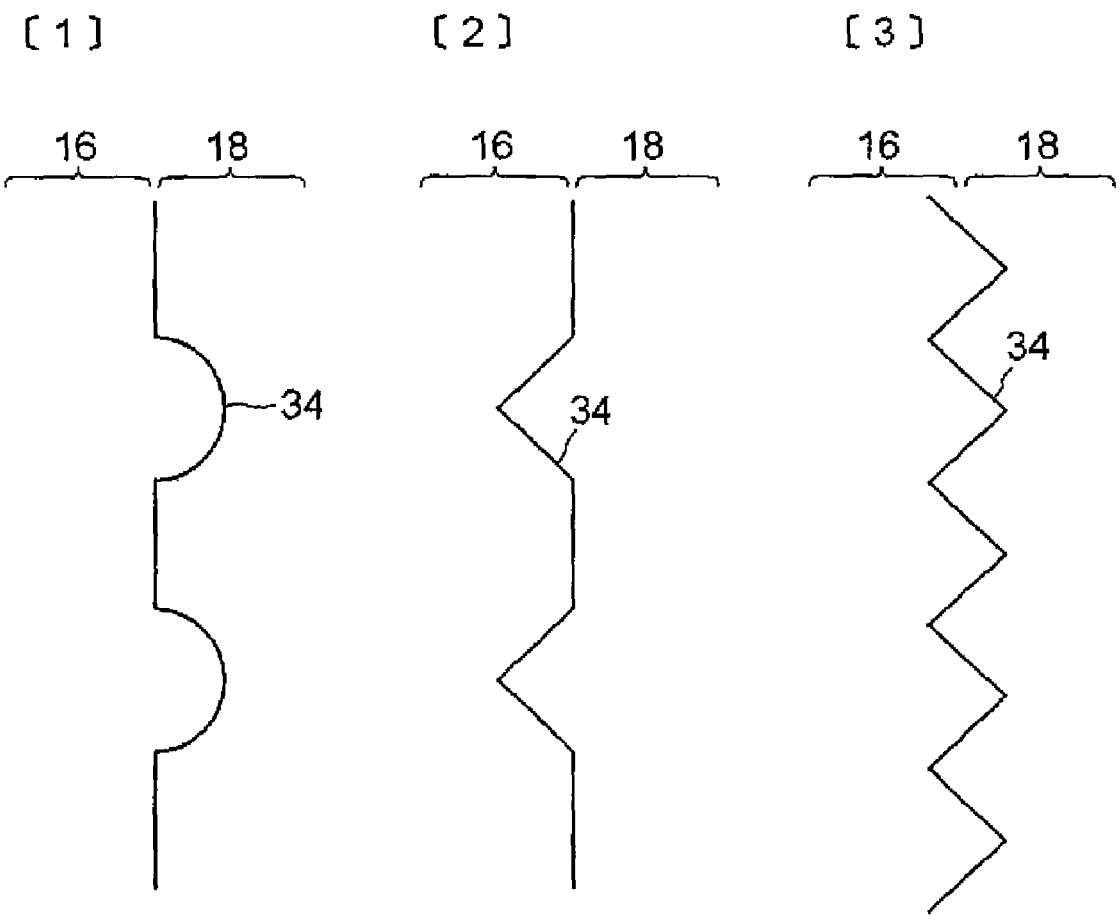

Further, although the boundary between the large heat capacity part 16 and the small heat capacity part 18 is set to be a rectangle wavy shape, it is not limited to this shape. It may take any shape provided that the distance between the large heat capacity parts 16 is not constant, as shown in FIG. 10. Further, the opposing boundaries are not required to be symmetry, but the shape of the grain boundary 34 becomes complicated.

Next, as the gate insulating film 37, a $SiO_2$ film was deposited by the PECVD method so as to have a film thickness of 50 nm. Then, $WSi_2$ film was deposited by the sputtering, to thereby form a gate electrode 40 by the PR method and the DE method (FIG. 4). Then, a source/drain region 46 was formed by introducing an impurity, and an interlayer insulating film 47, a contact hole 48, a source/drain electrode 49, and the like were formed, whereby a TFT was completed (FIG. 5).

The channel region of the TFT may be formed over the large crystal grains 26 in two rows corresponding to the required gate length and TFT characteristics (FIG. 4), or may be made within the large crystal grain 26 in one row (FIG. 4), or may be made inside each of the large crystal grains 26 in two rows as a double gate structure (FIG. 4). A TFT in which the large crystal grain 26 is used as a channel region shows high mobility and low threshold voltage characteristics.

For example, when the channel length was set to 1 μm in the structure shown in FIG. 5, the mobility and the threshold voltage of an n-channel TFT when formed inside the large crystal grain 26 was 400 $cm^2/Vs$ and 0.6V, respectively. On the other hand, when a TFT was formed in which only the large heat capacity part 16 was an active layer, the mobility and the threshold voltage were 160 $cm^2/Vs$ and 1.5V, respectively (FIG. 5). Further, when a TFT was formed in which only the small heat capacity part 18 was an active layer, that is, a micro-crystallized polycrystalline Si film was the channel region, the mobility and the threshold voltage were 70 $cm^2/Vs$ and 2.2V, respectively (FIG. 5).

By using a TFT having a threshold voltage of 0.6V and a TFT having a threshold voltage of 1.5V formed as described above, a thin film integrated circuit including a level shift circuit, a power supply boosting circuit, a driving circuit, a current mirror pixel circuit was produced. Then, a 2.1 type QVGA organic EL display device having the thin film integrated circuit, in which 10V drive is possible with a 2.5V input, was produced. Next, a mobile telephone incorporating the organic EL display device as a display element was produced.

Second Example

A second example based on the first embodiment of the present invention will be explained by using FIG. 11.

Similar to the first example, the amorphous Si film 14 was deposited on the insulating substrate 12, and the large heat capacity part 16 and the small heat capacity part 18 were formed. However, the boundary between the large heat capacity part 16 and the small heat capacity part 18 was in a linear shape, and the distance between the large heat capacity parts 16 was 5 μm. As a result, when a laser beam was irradiated under the same condition as that of the first example, a micro-crystallized region 64 of 1 μm width was formed between the large crystal grains 26 in two rows, as shown in FIG. 11.

Depending on the required leak current characteristics and the breakdown voltage of the TFT, an LDD region 66 must be formed. FIG. 11 shows an example of a TFT structure of a one-sided LDD structure, and FIG. 11 shows an example of a double-gate TFT structure of double-sided LDD structure. Here, if the micro-crystallized region 64 is used as the LDD region 66, it is advantageous to increase the layer resistance of the LDD region 66. Therefore, it is possible to form a TFT having a lower leak current value and higher breakdown voltage.

If the micro-crystallized region 64 lies over the channel region 41 and the LDD region 66, the mobility reduces and the leak current increases due to the hopping conductance of the grain boundary. Therefore, in order to obtain a TFT having characteristics of high mobility, a low threshold voltage and a low leak current, the micro-crystallized region 64 is desirably positioned only inside the LDD region 66.

Third Example

Figure 12:
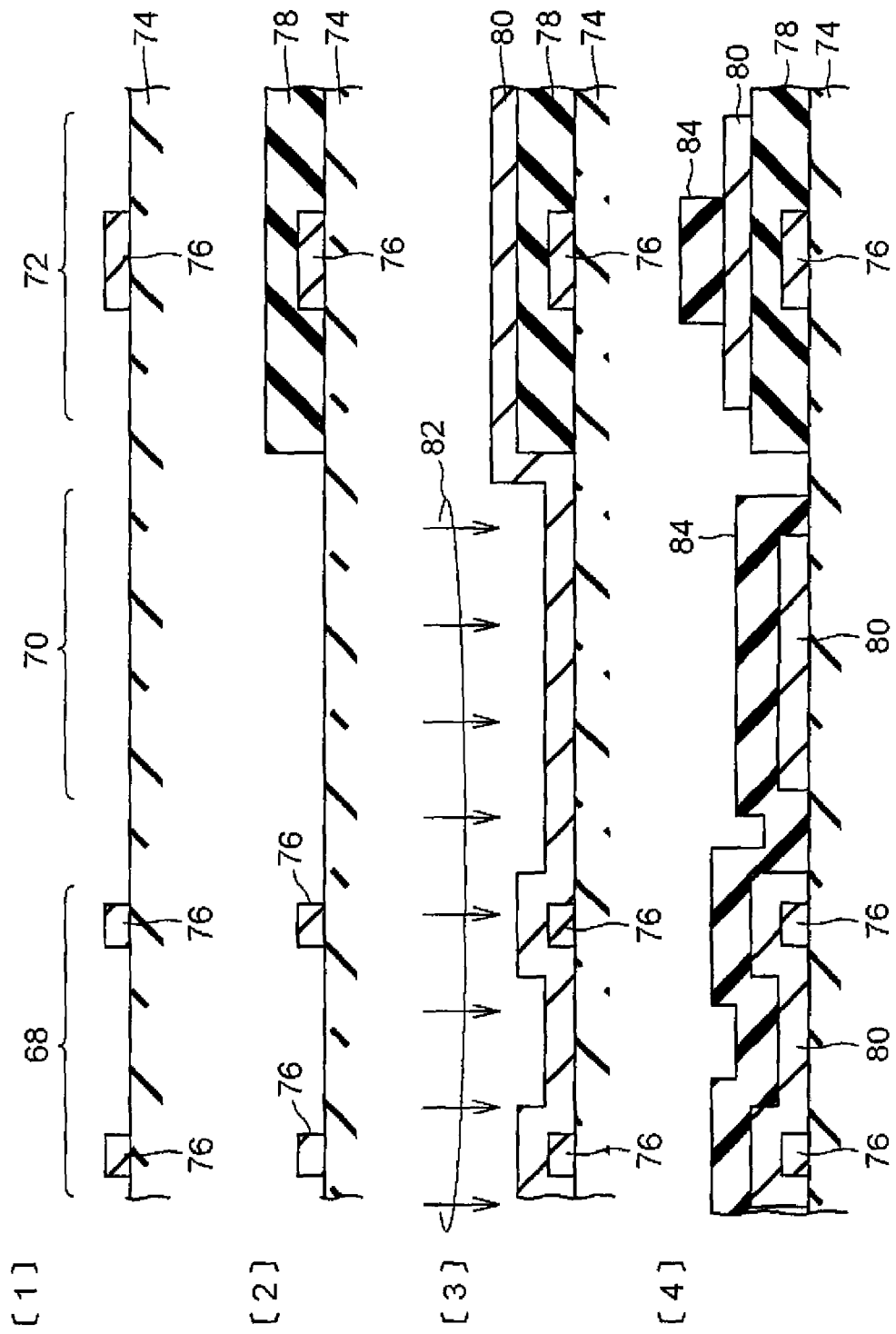
FIG. 12 is a sectional view showing a third example of the present invention (No. 1), in which a manufacturing step proceeds in sequence from FIG. 12 to FIG. 12.

As for a third example based on the second embodiment of the present invention, a method of manufacturing a TFT substrate for a liquid crystal display device in which TFTs showing three kinds of threshold voltage characteristics are formed on the same substrate is described, by using FIGS. 12 and 13.

Three kinds of TFTs are, a low threshold voltage polycrystalline Si TFT (low threshold voltage TFT) 68 in which a large crystal grain is used as a channel region, an intermediate threshold voltage polycrystalline Si TFT (intermediate threshold voltage TFT) 70 in which a micro-crystallized crystal grain is used as a channel region, and a high threshold voltage amorphous Si TFT (high threshold voltage TFT) 72, respectively.

As an insulating substrate 74, an OA-10 glass substrate made by Nippon Electric Glass Co., Ltd. in which a $SiO_2$ film was deposited to have a film thickness of 100 nm was used as a cover film. Then, A Ta film 76 was deposited so as to have a film thickness of 80 nm by the sputtering. Then, the Ta film 76 was patterned such that the Ta film 76 was used as an auxiliary film forming a large heat capacity part in the low threshold voltage TFT 68, and that the Ta film 76 was used as a gate electrode in the high threshold voltage TFT 72. Note that the distance between the patterned Ta films 76 in the low threshold voltage TFT 68 was 5 μm (FIG. 12).

Next, a SiN film 78 was deposited so as to have a film thickness of 350 nm by the PECVD method, as a gate insulating film of the high threshold voltage TFT 72. Then, the SiN film 78 on the region of the low threshold voltage TFT 68 and the intermediate threshold voltage TFT 70 was removed by patterning (FIG. 12).

Then, an amorphous Si film 80 was deposited so as to have a film thickness of 40 nm by the PECVD method. Then, the amorphous Si film 80 was dehydrogenized through annealing for 10 minutes at 500° C. Next, a laser beam 82 was irradiated to the amorphous Si film 80 on the region of the low threshold voltage TFT 68 and the intermediate threshold voltage TFT 70. The energy density at this time was set to 430 mJ/cm$^2$ which was not less than the microcrystallization threshold (410 mJ/cm$^2$) in a film thickness of 40 nm. As a result, large crystal grains in two rows having the grain diameter of 2.5 μm were formed in the channel region of the low threshold voltage TFT 68. Since the Ta film 76 was used for forming the large heat capacity part, the large crystal grain diameter increased from 2 μm of the second example. Note that in the channel region of the intermediate threshold voltage TFT 70, a micro-crystallized crystal grain having the grain diameter of not more than 20 nm was formed. On the other hand, the channel region in the high threshold voltage TFT 72 remains as an amorphous phase (FIG. 12).

Then, the amorphous Si film 80, a part of which was crystallized, was patterned so as to be an active layer of each TFT. Then, a $SiO_2$ film 84 was deposited to have a film thickness of 50 nm by the PECVD method. Then, the $SiO_2$ film 84 was patterned such that the $SiO_2$ film 84 was used as a gate insulating film in the low threshold voltage TFT 68 and the intermediate threshold voltage TFT 70, and that the $SiO_2$ film 84 was used as a channel protection film in the high threshold voltage TFT 72 (FIG. 12).

Then, a two layered film 86 in which the lower layer was an n$^+$-micro-crystallized Si layer and the upper layer was a Cr layer was deposited. The n$^+$-micro-crystallized Si layer was deposited so as to have a film thickness of 80 nm by the PECVD method, and the Cr layer was deposited to have a film thickness of 150 nm by using the sputtering, respectively. Then, the two-layer film 86 was patterned such that the two-layer film 86 was used as a gate electrode in the low threshold voltage TFT 68 and in the intermediate threshold voltage TFT 70, and that the two-layer film 86 was used as a source/drain electrode in the high threshold voltage TFT 72 (FIG. 13).

Then, an impurity was introduced by the ion doping method in a source/drain region and in an LDD region of the low threshold voltage TFT 68 and the intermediate threshold voltage TFT 70. Then, plasma hydrogenation processing was performed to all TFTs.

Next, a SiN film 88 was deposited as an interlayer insulating film. Then, a contact hole 90 of the low threshold voltage TFT 68 and the intermediate threshold voltage TFT 70 was opened, and an Al film 92 forming a source/drain electrode was deposited, and the Al film 92 was patterned to be a prescribed shape. Then, a SiN film 94 serving as a passivation film was deposited. Finally, a contact hole 96 of the high threshold voltage TFT 72 was opened, and an ITO film 98 serving as a pixel electrode was deposited, and an ITO film 98 was patterned (FIG. 13).

Threshold voltages of the low threshold voltage TFT 68, the intermediate threshold voltage TFT 70 and the high threshold voltage Si TFT 72, formed consequently, were 0.6V, 2.2V and 5V, respectively.

By using the low threshold voltage TFT 68 and the intermediate threshold voltage TFT 70 formed as described above, a thin film integrated circuit having a level shift circuit, a power supply boosting circuit, a driving circuit and the like was formed, and a 3.5-inch SXGA liquid crystal display device realizing 20V output with a 2.5V input in which the high threshold voltage TFT 72 serves as a pixel switch was produced. Then, a personal digital assistance (PDA) incorporating the liquid crystal display device as a display element was produced.

Fourth Example

A fourth example based on the third embodiment of the present invention will be explained by using FIG. 7.

Similar to the first example, an amorphous Si film 14 having the large heat capacity part 16 and the small heat capacity part 18 was formed on an insulating substrate. Here, the distance between the large heat capacity parts 16 was set to 4 μm. Then, an excimer laser beam 60 of a narrow linear shape with the aperture of 30 mm length by 3 μm width was irradiated with the energy density of 420 mJ/cm$^2$. As a result, a large crystal grain 26 having grain diameters of 2 μm and 1.2 μm in the beam length direction and in the beam width direction respectively are formed in the small heat capacity part 18. Then, using the large crystal grain 26 as a seed crystal, the excimer laser beam 60 is scan-irradiated with pitches of 0.8

μm, to thereby obtain the continuously grown crystal grain 62 with a fine positional accuracy.

FIG. 8 shows a case where a beam of a narrow linear shape is scan-irradiated by using a conventional homogeneous amorphous Si film 14, without providing a heat capacity difference. In FIG. 8, the continuous growth crystal grain 63 is not controlled in the generation position in the beam length direction, and the crystal grain diameter of the beam length direction is as small as about 1 μm. Further, it is not controlled completely in the grain growth direction, so if it grows diagonally, there may be formed a short crystal grain by colliding against another crystal grain so that the growth ends.

Fifth Example

A fifth example based on the fourth embodiment of the present invention will be explained by using FIG. 9.

Similar to the fourth example, an amorphous Si film 14 having the large heat capacity part 16 and the small heat capacity part 18 was formed on an insulating substrate, and a narrow linear laser beam 60 was scan-irradiated. However, the large heat capacity part 16 was provided only near the laser irradiation starting position, and the distance x between the large heat capacity parts 16 was 4 μm, the distance x between the large heat capacity part 16 at the seed crystal forming part was 2 μm, the back end angle α was 60 degrees, and the largest length of the large heat capacity part 16 in the beam scan direction was 7 μm.

As a result, the continuously grown crystal grain 62, position-controlled, was formed without providing the large heat capacity part 16 along the whole width of the beam scan region.

Note that the present invention is not limited to the embodiments and the examples described above. For example, a small heat capacity part and a large heat capacity part may be formed by forming a first amorphous Si film on a substrate, etching a part of the first amorphous Si film, and forming a second non-crystal Si film on the substrate including the etched first amorphous Si film.

Seventh Embodiment

Next, a seventh embodiment of the present invention will be explained by using FIGS. 16 to 18.

There are two problems in etching in the case where a large heat capacity part 16 and a small heat capacity part 18 are included.

A first problem is, as shown in FIG. 16, about etching in a case where each of the large heat capacity part 16 and the small heat capacity part 18 is continued in a band shape. The film thickness of the large heat capacity part 16 shown in FIG. 16 is thick, and the film thickness of the small heat capacity part 18 is thin, and the large heat capacity part 16 and the small heat capacity part 18 has a film thickness difference.

(1) As shown in FIG. 16, when etching is performed corresponding to the film thickness of the large heat capacity part 16 by using a mask 301, side etching with respect to the large crystal grain 26 of the region 302 having the small heat capacity part 18 progresses as shown in FIG. 16, and over etching also progresses in the insulating substrate 12 of the lower layer.

(2) In contrast, when etching is performed corresponding to the film thickness of the small heat capacity part 18, the film is not removed completely in the large heat capacity part 16, and the film of the large heat capacity part 16 remains with a halfway film thickness.

In the case of (2) above, if a plurality of TFTs aligned in the vertical direction of FIG. 16 are to be formed from a region 303 having the large heat capacity part 16 continued as shown in FIG. 16, there may be a case where the large heat capacity parts 16 of different TFTs cannot be separated but are formed continuously.

In order to solve this problem, the large heat capacity part 16 must be independent corresponding to each TFT single body. Once the large heat capacity part 16 is independent, no problem is caused even though the large heat capacity part 16 remains with a halfway film thickness by the etching corresponding to the film thickness of the small heat capacity part 18.

Now, in the seventh embodiment of the present invention, as shown in FIG. 17, two large heat capacity parts 16 are formed while being independent from the other large heat capacity parts (not shown). Even in such a case, two large heat capacity parts 16 are formed across one small heat capacity part 18. As shown in FIG. 17, large crystal grains 26 crystal-grown from the large heat capacity part 16 are crystal-grown toward a region (a small heat capacity part forming a channel region) interposed between two large heat capacity parts 16 and also crystal-grown radially in the surrounding part of each large heat capacity part 16.

When the large crystals 26 are crystal-grown as shown in FIG. 17, if etching is performed corresponding to the thin film thickness of the small heat capacity part 18 by using a mask 301 similar to FIG. 16, side etching with respect to the large crystal grain 26 does not proceed as shown in FIG. 17, and the insulation substrate 12 of the lower layer is not over-etched as well. On the other hand, in the large heat capacity part 16, the film does not removed completely, and the film of the large heat capacity part 16 remains to have a halfway film thickness. However, since the large heat capacity part 16 is formed in an independent manner, the large heat capacity parts 16 of the different TFTs can be separated completely.

Next, a second problem will be explained. Referring to FIG. 17, the large crystal grains 26 are crystal-grown until a grain boundary is formed in the channel region in between the two large heat capacity parts 16. However, the large crystal grains 26 are crystal grown separating into right and left at an angular part having curvature radius r of the large heat capacity part 16 as shown in FIG. 17, in a region not position-controlled by the large heat capacity part 16, so the micro-crystallized region 64 is formed in a part separating in right and left at the angular part. If the channel region includes the micro-crystallized region 64, an adverse effect will be caused to the characteristics of the TFT.

In view of the above, the seventh embodiment of the present invention is characterized in that the edge part 18a in the channel width direction in the channel region formed in the small heat capacity part is not protruded outside than the edge part 16a in the channel width direction of the large heat capacity part 16, as shown in FIGS. 18[1] and 18[2]. Therefore, in the seventh embodiment of the present invention, it is possible to form a channel region having a width W between the two edge parts 18a in the channel width direction of the channel region formed in the small heat capacity part 18. Thereby, the micro-crystallized region 64 will not be included in the channel region having the width W in the channel width direction, and the channel region is formed entirely of the large crystal grains 26, so it is possible to secure the desired characteristics of the TFT.

In order to form a channel region with the width W between the two edge parts 18a of the small heat capacity part, etching is performed by using a mask 301 shown in FIGS. 18[1] and 18[2], for example.

The mask 301 in the seventh embodiment of the present invention shown in FIG. 18 is formed in a rectangle shape shown by the dotted line. Then, etching is performed corresponding to the film thickness of the small heat capacity part 18. In this case, in the large heat capacity part 16, the film is not removed completely and the region 304 where the film of the large heat capacity part 16 has a halfway film thickness remains. However, since the large heat capacity part 16 is formed independently, the large heat capacity parts 16 of different TFTs can be separated completely.

The mask 301 in the seventh embodiment of the present invention shown in FIG. 18 is different in its size in the large heat capacity part 16 and the small heat capacity part of the channel region shown by the dotted line. The mask 301 for covering the small heat capacity part in the channel region is formed in a rectangle shape, the size of which corresponds to the dimension W in the channel width direction of the channel region formed in the small heat capacity part similar to FIG. 18. On the other hand, the mask 301 for covering the large heat capacity part 16 has a larger area than the mask 301 for covering the small heat capacity part 16. That is, the mask 301 for covering the large heat capacity part 16 is formed to be in an rectangle shape consisting of long edges having a length protruding the edge part 16a in the channel width direction of the large heat capacity part 16, and short edges having a length protruding the end part 16b in the channel direction of the large heat capacity part 16.

When etching is performed by using the mask 301 according to the seventh embodiment of FIG. 18, only extra large crystal grains 26 with thin film thickness are exposed from the mask 301, whereby only the small heat capacity part 18 is etched.

Note that the shape of the mask 301 is not limited to those shown in FIGS. 18[1] and 18[2]. Further, the boundary shape between the two large heat capacity parts 16 and the small heat capacity part is a rectangle wavy shape or a triangle wavy shape, but it is not limited to these shapes.

INDUSTRIAL AVAILABILITY

According to the present invention, since a polycrystalline semiconductor thin film is formed by laser annealing of an energy density with which the small heat capacity part melts completely but a large heat capacity part does not melt completely, a channel part is formed by large crystal grains grown from the boundaries between the small heat capacity part and the large heat capacity parts. Therefore, it is possible to realize characteristics of low threshold voltage value, high carrier mobility and low leak current by using a conventional laser annealing device. Further, if distances between the large heat capacity parts differ depending on positions, two boundaries between the large heat capacity parts and the small heat capacity part are not in parallel, whereby positions of crystal grains grown from the boundaries can be controlled in two dimensions.

In other words, the following effects can be achieved in the present invention. Large crystal grains, position-controlled, can be formed easily, and high performance TFTs in which the crystal grain positions and the channel position are aligned can be formed easily. Further, plural types of TFTs having different threshold voltage characteristics can be formed on the same substrate easily. Further, by using a TFT substrate having a thin film integrated circuit formed of plural types of TFTs having different threshold voltage characteristics, it is possible to obtain an electronic apparatus of low power consumption in which an input voltage is lowered.

What is claimed is:

1. The method of manufacturing a polycrystalline semiconductor thin film, comprising:
a semiconductor film forming step in which a nonmonocrystalline semiconductor thin film including a large heat capacity part having a large heat capacity and a small heat capacity part having a small heat capacity is formed on a substrate; and
an annealing step in which a laser beam of an energy density with which the small heat capacity part melts completely but the large heat capacity part does not melt completely is irradiated to the non-monocrystalline semiconductor thin film, wherein
in the laser annealing step,
the laser beam is a pulse laser beam of a spot diameter processed to be in a linear shape having a short axis and a long axis, and
the laser beam is irradiated while being moved sequentially in a short axial direction with a moving distance not more than a grain diameter of a seed crystal of the non-single crystalline semiconductor thin film in the short axial direction.

2. The method of manufacturing the polycrystalline semiconductor thin film, as claimed in claim 1, wherein the large heat capacity part only exists in a part of a region to which the laser beam is irradiated.

3. A method of manufacturing a polycrystalline semiconductor thin film, comprising:
a semiconductor thin film forming step in which a non-monocrystalline semiconductor thin film including a large heat capacity part having a large heat capacity and a small heat capacity part having a small heat capacity is formed on a substrate; and
an annealing step in which a laser beam of an energy density with which the small heat capacity part melts completely but the large heat capacity part does not melt completely is irradiated to the non-monocrystalline semiconductor thin film, wherein
in the semiconductor thin film forming step,
the small heat capacity part is interposed between two large heat capacity parts, and distances between the large heat capacity parts are made different depending on positions, to thereby form the non-monocrystalline semiconductor thin film.

* * * * *